US011244734B2

(12) United States Patent
Baraskar et al.

(10) Patent No.: US 11,244,734 B2
(45) Date of Patent: Feb. 8, 2022

(54) MODIFIED VERIFY SCHEME FOR PROGRAMMING A MEMORY APPARATUS

(71) Applicant: SanDisk Technologies LLC, Addison, TX (US)

(72) Inventors: Ashish Baraskar, Santa Clara, CA (US); Henry Chin, San Jose, CA (US); Ching-Huang Lu, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/728,716

(22) Filed: Dec. 27, 2019

(65) Prior Publication Data

US 2021/0202022 A1 Jul. 1, 2021

(51) Int. Cl.
*G11C 16/10* (2006.01)
*G11C 16/34* (2006.01)
(Continued)

(52) U.S. Cl.
CPC ...... *G11C 16/3459* (2013.01); *G11C 16/0483* (2013.01); *G11C 16/08* (2013.01); *G11C 16/10* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC . G11C 16/3459; G11C 16/10; G11C 16/0483; G11C 16/08; G11C 16/26; H01L 27/11519; H01L 27/11556; H01L 27/11582; H01L 27/11565
USPC .................................................. 365/185.22
See application file for complete search history.

(56) References Cited

U.S. PATENT DOCUMENTS 6,671,207 B1   12/2003   Parker
8,223,556 B2   7/2012    Dutta et al.
(Continued)

FOREIGN PATENT DOCUMENTS

CN          102385930 A        3/2012

OTHER PUBLICATIONS

International Search Report and Written Opinion, PCT/US2020/024879, dated Sep. 17, 2020.

*Primary Examiner* — Hoai V Ho
*Assistant Examiner* — Minh Dinh
(74) *Attorney, Agent, or Firm* — Dickinson Wright PLLC; Steven Hurles

(57) ABSTRACT

A memory apparatus and method of operation is provided. The apparatus includes memory cells coupled to a control circuit. The control circuit is configured to perform a first programming stage including iteratively programming each of the memory cells to first program states and verifying that the memory cells have a threshold voltage above one of a plurality of first verify voltages corresponding to the first program states. The first programming stage ends before all of the memory cells are verified thereby leaving a fraction of the memory cells below the one of the plurality of first verify voltages. The control circuit also performs a second programming stage including iteratively programming each of the memory cells to second program states and verifying that at least a predetermined number of the memory cells have the threshold voltage above one of a plurality of second verify voltages corresponding to the second program states.

20 Claims, 24 Drawing Sheets

(51) Int. Cl.
*G11C 16/04* (2006.01)
*G11C 16/08* (2006.01)
*H01L 27/11565* (2017.01)
*H01L 27/11556* (2017.01)
*H01L 27/11582* (2017.01)
*H01L 27/11519* (2017.01)
*G11C 16/26* (2006.01)

(56) References Cited

U.S. PATENT DOCUMENTS

| | | |
|---|---|---|
| 9,123,424 B2 | 9/2015 | Oowada et al. |
| 9,336,866 B2 | 5/2016 | Kwak et al. |
| 9,858,991 B2 | 1/2018 | Sarin et al. |
| 10,014,063 B2 | 7/2018 | Tseng et al. |
| 10,102,903 B1 | 10/2018 | Vali et al. |
| 2005/0185470 A1 | 8/2005 | Suzuki et al. |
| 2007/0115726 A1 | 5/2007 | Cohen et al. |
| 2010/0246260 A1* | 9/2010 | Kang .................. G11C 11/5621 365/185.03 |
| 2015/0146484 A1* | 5/2015 | Lee ..................... G11C 11/5628 365/185.03 |
| 2019/0147964 A1* | 5/2019 | Yun .................... G11C 16/3459 365/185.22 |
| 2019/0156904 A1 | 5/2019 | Hong |

* cited by examiner

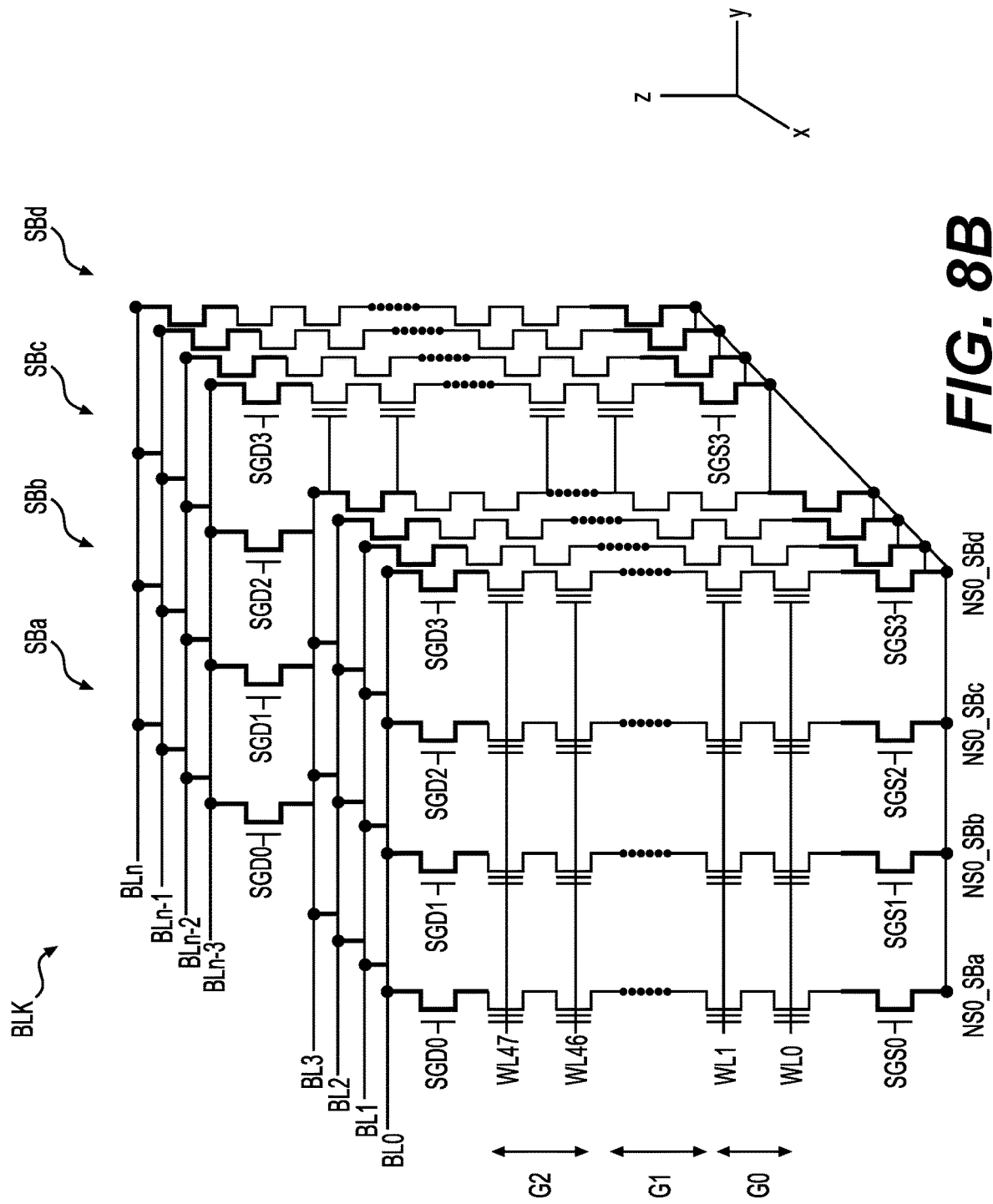

| STATE | FIRST STAGE PGM LOOPS* | EXP 1 | | EXP 2 | |
|---|---|---|---|---|---|
| | | NLP | PVFY REDUCED BY | NLP | PVFY REDUCED BY |
| 1 | - | - | - | - | - |
| 2 | N | P | N-P | P-2 | N-(P-2) |
| 3 | N+1 | P | N+1-P | P | N-(P-1) |
| 4 | N+2 | P | N+2-P | P+2 | N-P |

*FIG. 13*

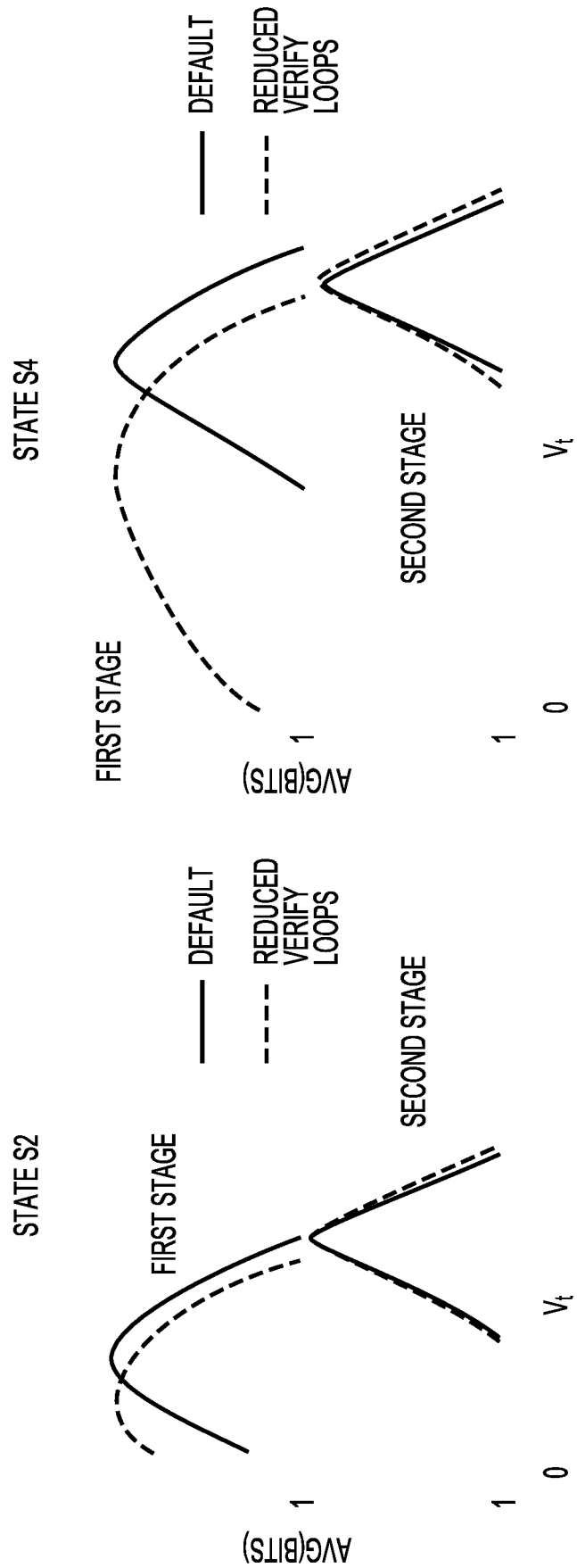

MODIFIED VERIFY SCHEME FOR PROGRAMMING A MEMORY APPARATUS

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory apparatus includes memory cells which may be arranged in strings, for instance, where select gate transistors are provided at the ends of the string to selectively connect a channel of the string to a source line or bit line. However, various challenges are presented in operating such memory devices. Accordingly, there is still a need for improved memory apparatuses.

SUMMARY

This section provides a general summary of the present disclosure and is not a comprehensive disclosure of its full scope or all of its features and advantages.

An object of the present disclosure is to provide a memory apparatus and a method of forming the memory apparatus that address and overcome the above-noted shortcomings.

Accordingly, it is an aspect of the present disclosure to provide an apparatus including a plurality of memory cells. The apparatus also includes a control circuit coupled to the plurality of memory cells. The control circuit is configured to perform a first programming stage including iteratively programming each of the plurality of memory cells to one of a plurality of first program states and verifying that one or more of the plurality of memory cells has a threshold voltage above one of a plurality of first verify voltages corresponding to the plurality of first program states. The control circuit ends the first programming stage before all of the plurality of memory cells are verified thereby leaving a fraction of the plurality of memory cells below the one of a plurality of first verify voltages. The control circuit is also configured to perform a second programming stage including iteratively programming each of the plurality of memory cells to one of a plurality of second program states and verifying that at least a predetermined number of the plurality of memory cells each has the threshold voltage above one of a plurality of second verify voltages corresponding to the plurality of second program states.

According to another aspect of the disclosure a controller in communication with a plurality of memory cells is provided. The controller is configured to instruct the memory apparatus to perform a first programming stage. The first programming stage includes iteratively programming each of the plurality of memory cells to one of a plurality of first program states and verifying that one or more of the plurality of memory cells has a threshold voltage above one of a plurality of first verify voltages corresponding to the plurality of first program states and end the first programming stage before all of the plurality of memory cells are verified thereby leaving a fraction of the plurality of memory cells below the one of a plurality of first verify voltages. The controller also instructs the memory apparatus perform a second programming stage. The second programming stage includes iteratively programming each of the plurality of memory cells to one of a plurality of second program states and verifying that at least a predetermined number of the plurality of memory cells each has the threshold voltage above one of a plurality of second verify voltages corresponding to the plurality of second program states.

According to an additional aspect of the disclosure, a method of operating a memory apparatus including a plurality of memory cells is also provided. The method includes the step of performing a first programming stage including iteratively programming each of the plurality of memory cells to one of a plurality of first program states and verifying that one or more of the plurality of memory cells has a threshold voltage above one of a plurality of first verify voltages corresponding to the plurality of first program states and ending the first programming stage before all of the plurality of memory cells are verified thereby leaving a fraction of the plurality of memory cells below the one of a plurality of first verify voltages. The method continues with the step of performing a second programming stage including iteratively programming each of the plurality of memory cells to one of a plurality of second program states and verifying that at least a predetermined number of the plurality of memory cells each has the threshold voltage above one of a plurality of second verify voltages corresponding to the plurality of second program states.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 8B depicts another example view of NAND strings in sub-blocks according to aspects of the disclosure;

Figure 11:
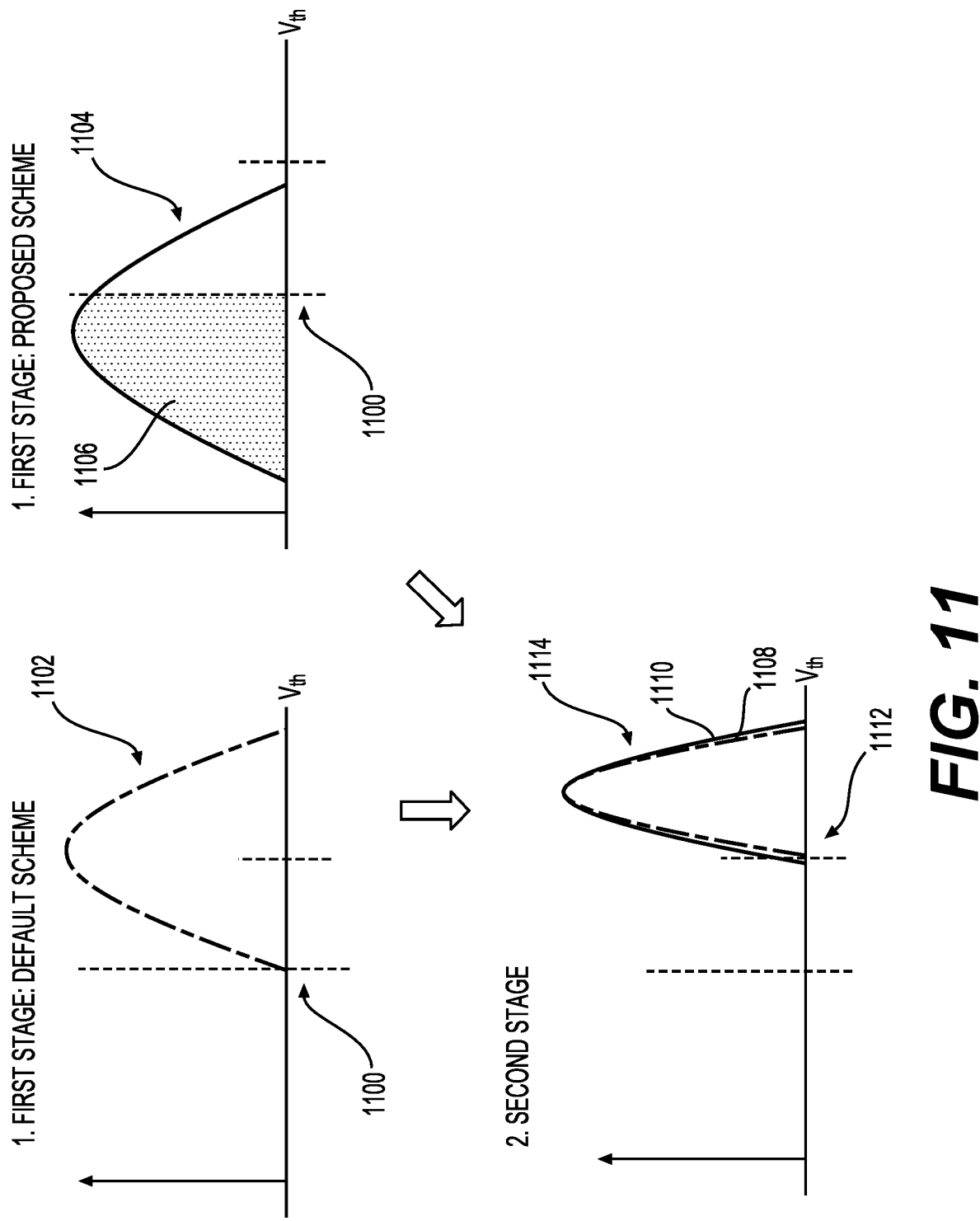
Figure 12:
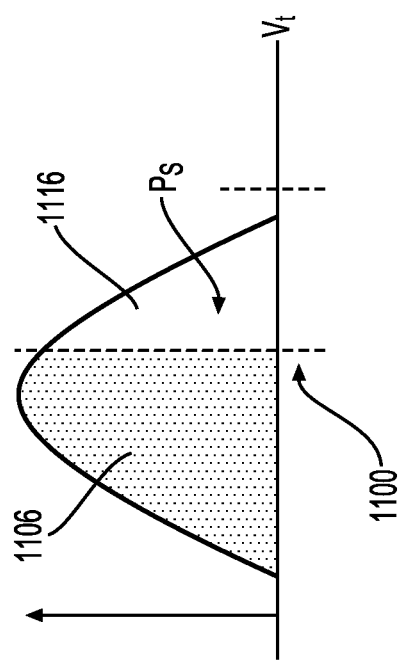
Figure 14A:
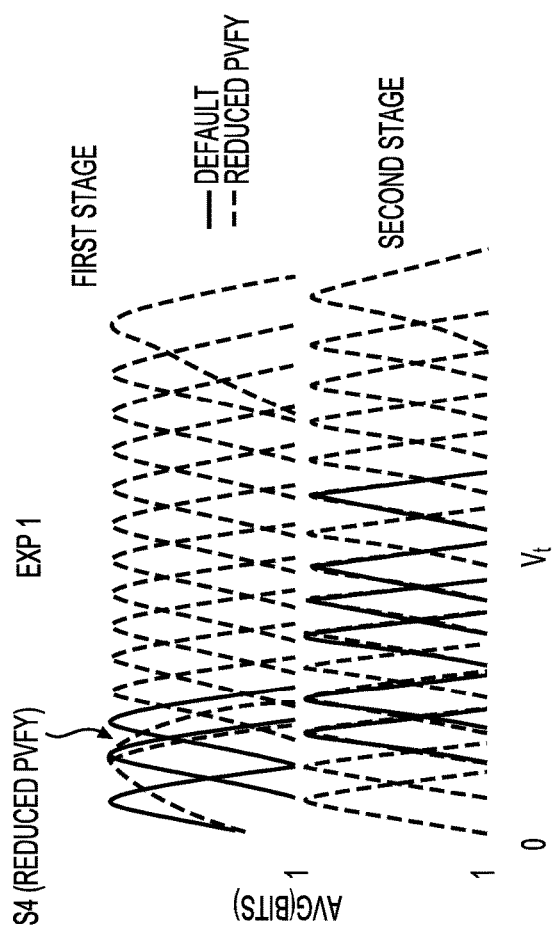
Figure 14B:
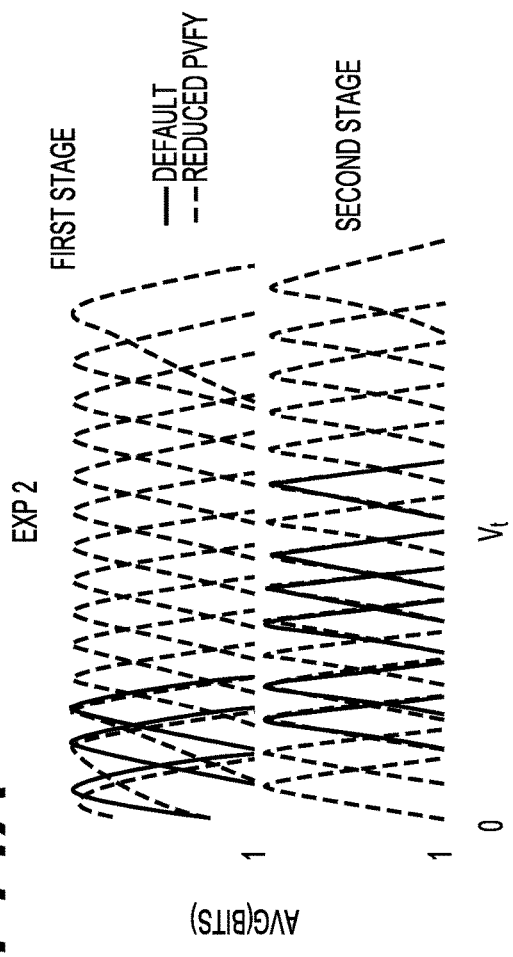
Figure 16:
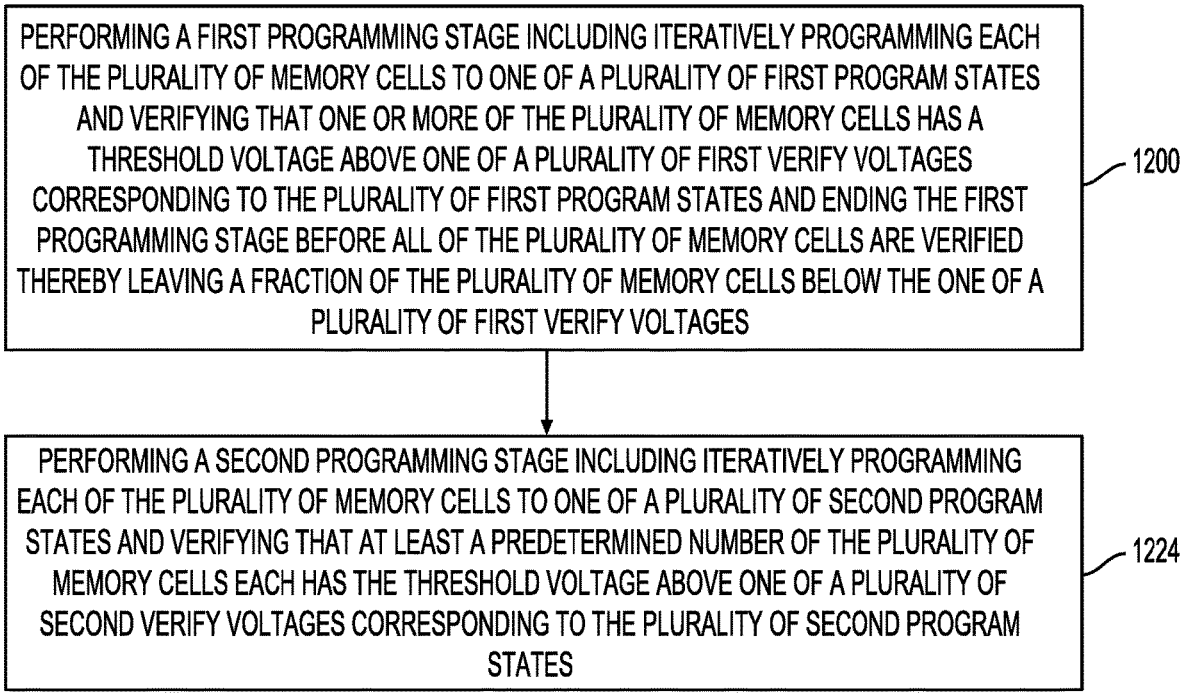
Figure 17A:
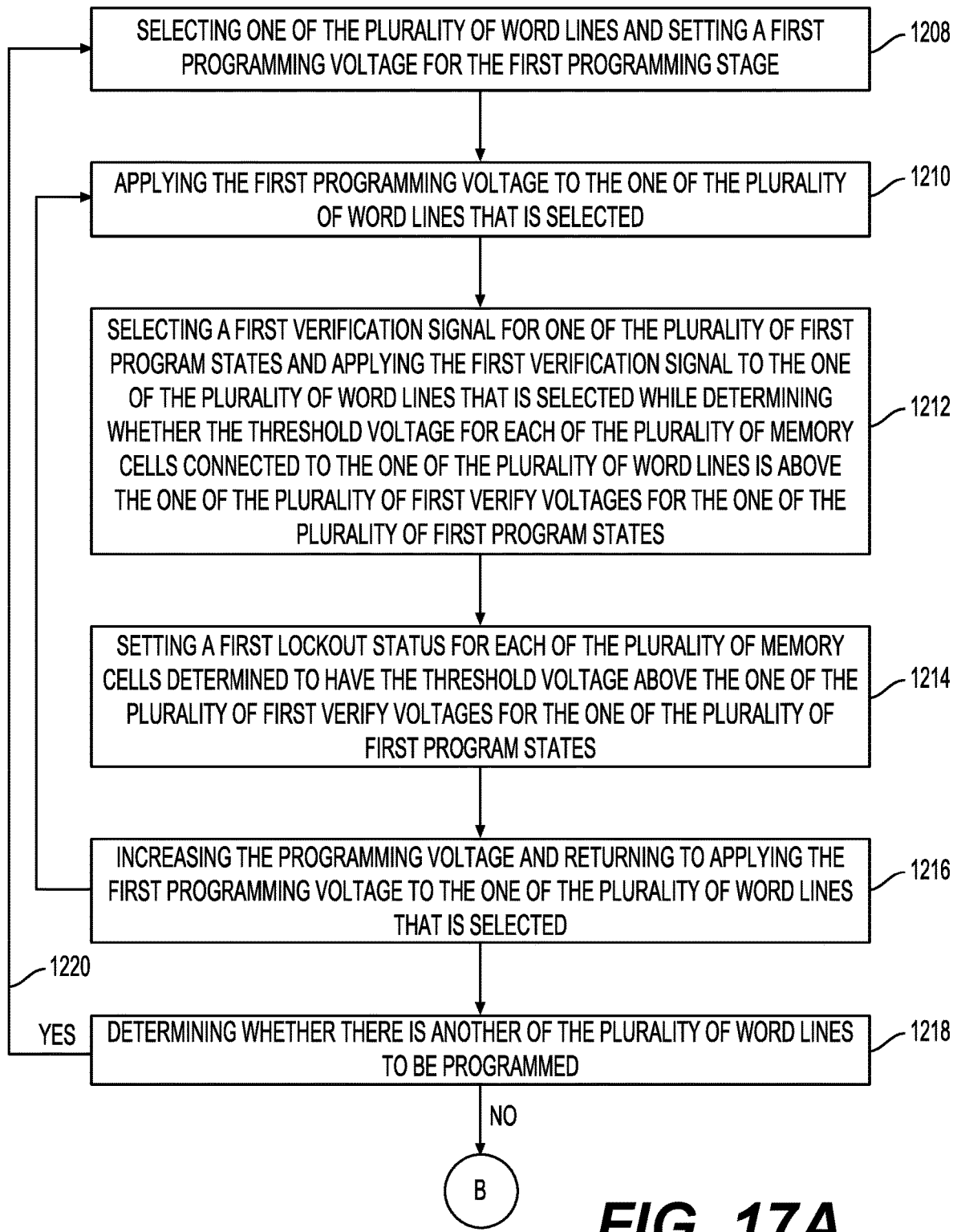
Figure 17B:
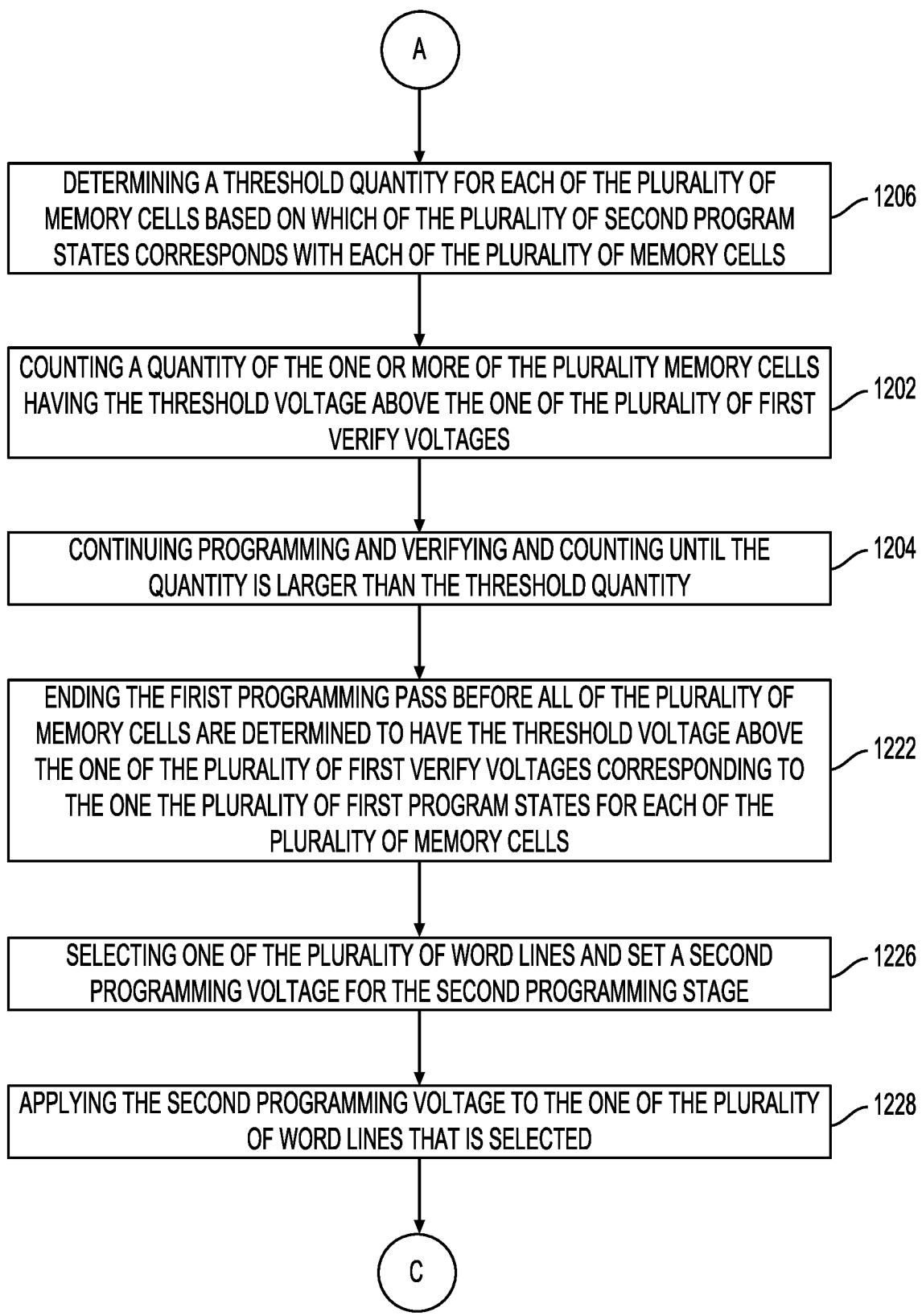
Figure 17C:
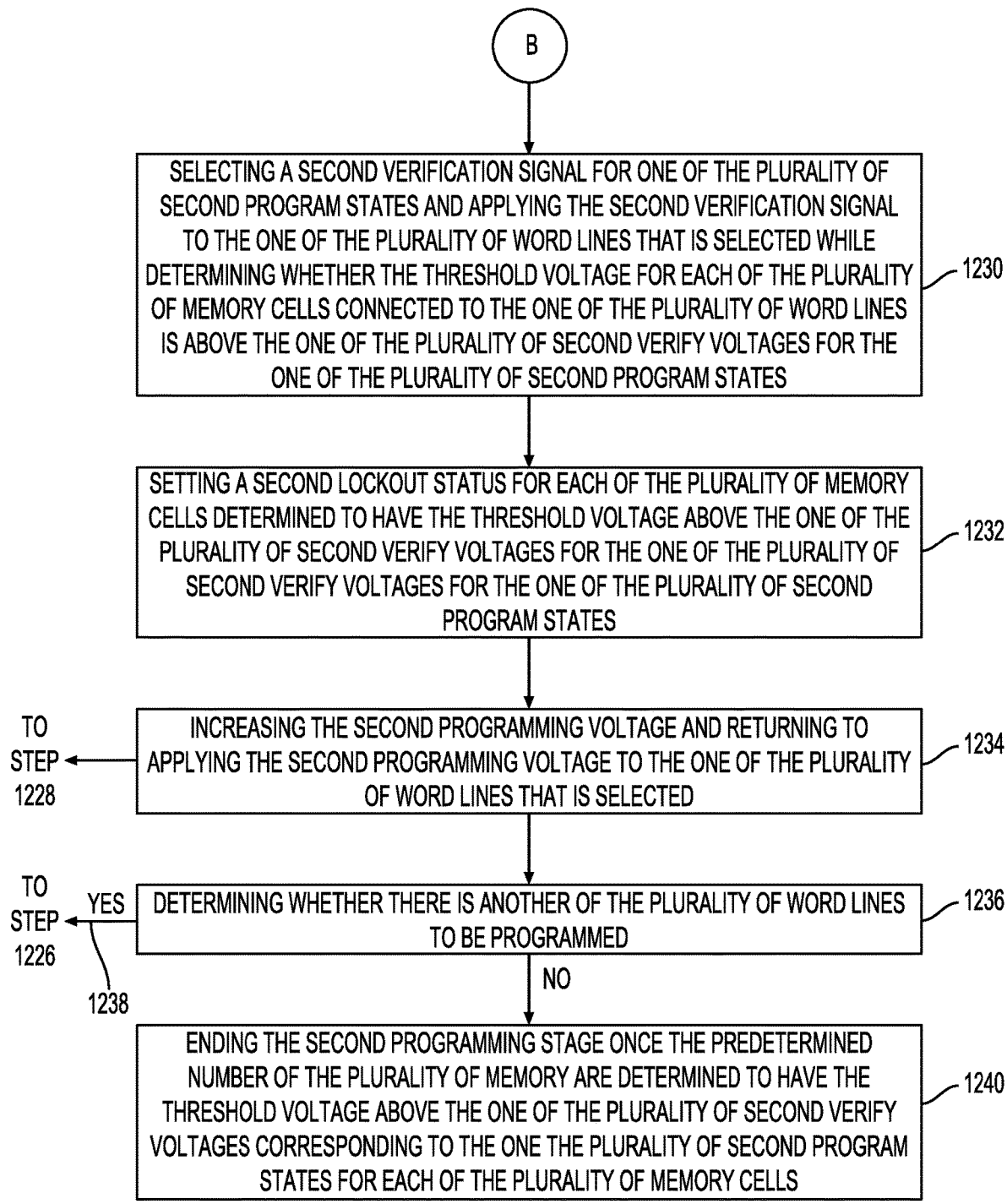

FIG. 11 shows a default first programming stage, a proposed first programming stage leaving a fraction of cells below a first stage verify level, and a default threshold voltage distribution after the default first programming stage and a second programming stage, a proposed threshold distribution after the proposed first programming stage and the second programming stage according to aspects of the disclosure;

FIG. 12 shows the first programming stage being stopped after the number of cells passing the first stage verify level is higher than the bit ignore number according to aspects of the disclosure;

FIG. 13 shows two experiments conducted to determine the impact of reduction of program verify loops by the apparatus according to aspects of the disclosure;

FIGS. 14A and 14B show threshold voltage distributions for a default condition (no program verify reduction) and reduced program verify condition for both experiments of FIG. 13 according to aspects of the disclosure;

FIGS. 15A and 15B show that the final threshold voltage distribution width after second programming stage is degraded more for upper states as compared to lower states in the experiments of FIG. 13 when a lower tail is left behind according to aspects of the disclosure; and FIGS. 16 and 17A-17C show steps of a method of operating the memory apparatus according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed state) different from the erased state. For example, in a two-bit per cell memory device, there are four data states including the erased state and three higher data states referred to as the A, B and C data states (see FIG. 10B). In a three-bit per cell memory device, there are eight data states including the erased state and seven higher data states referred to as the A, B, C, D, E, F and G data states. In a four-bit per cell memory device, there are sixteen data states including the erased state and fifteen higher data states referred to as the Er, 1, 2, 3, 4, 5, 6, 7, 8, 9, A, B, C, D, E and F data states.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 10B, a memory cell which is to be programmed to the A data state can be subject to verify tests at VvAf, an offset verify voltage of the A data state, and VvA, a final verify voltage of the A data state. By slowing the programming speed just before a memory cell completes programming, narrower Vth distributions can be achieved.

However, time is consumed in performing the verify tests. For example, typically, a verify test involves applying a verification signal to the control gates of the selected memory cells via a selected word line, pre-charging sense circuits which are connected to the selected memory cells via respective bit lines and observing an amount of discharge in the sense circuits for a specified discharge period. Moreover, this is repeated for each verify voltage of the verification signal. Also, the time consumed will increase as the number of data states increases.

Additionally, two stage programming schemes may be used to tighten the threshold voltage distributions, compared to full sequence or one stage programming schemes. Specifically, such two stage programming schemes can improve both neighbor word line interference (NWI) and short term data retention (STDR), resulting in tighter threshold voltage distributions. Nevertheless, two stage programming schemes can result in degraded performance compared to one stage programming schemes.

Figure 1A:
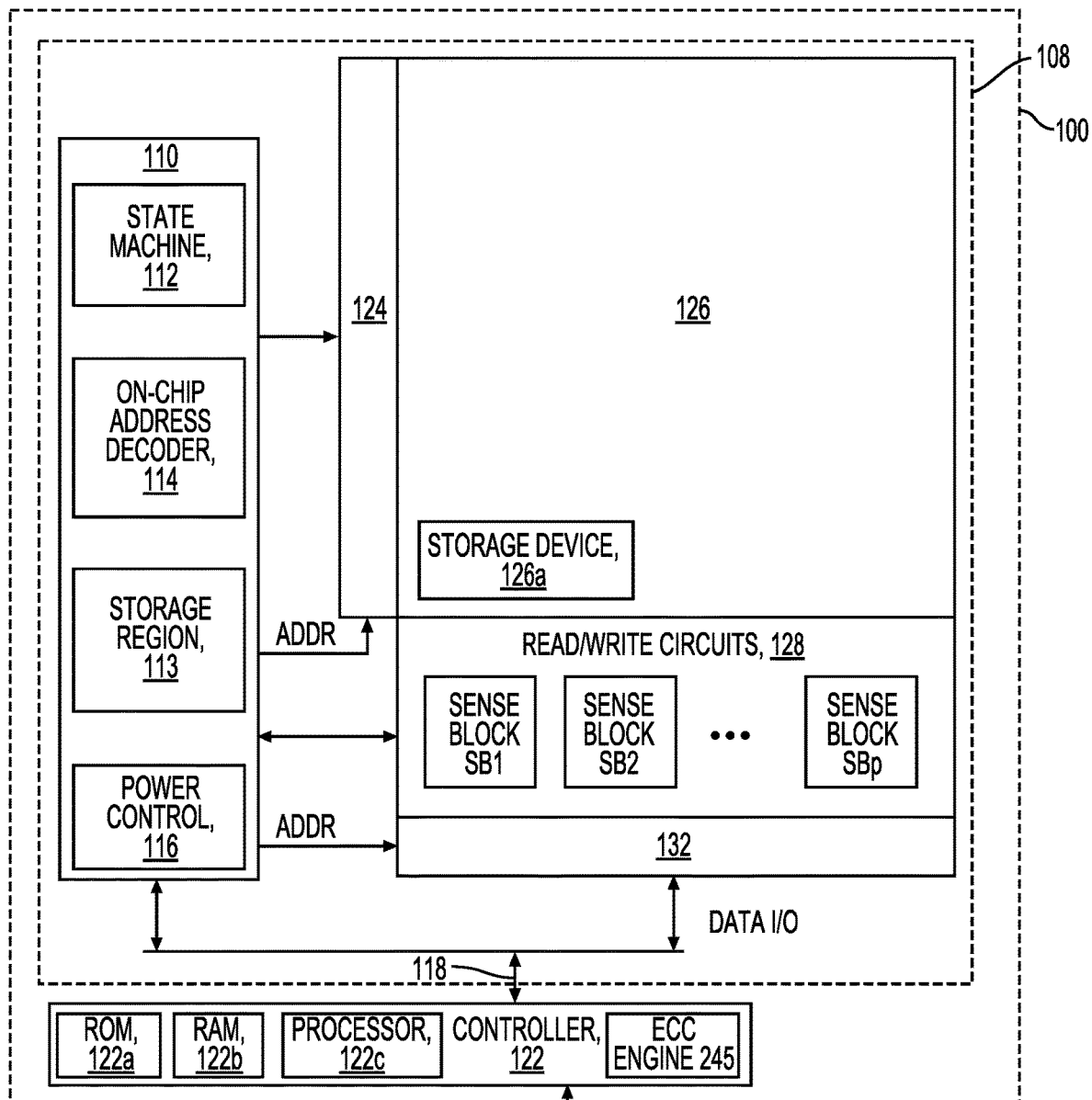
FIG. 1A is a block diagram of an example memory device according to aspects of the disclosure.

FIG. 1A is a block diagram of an example memory device. The memory device or apparatus 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein. These can be parameters related to a verify scheme.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein: the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

Figure 1B:
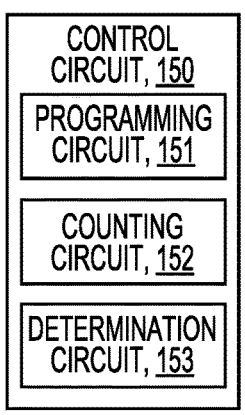
FIG. 1B is a block diagram of an example control circuit which comprises a programming circuit, a counting circuit, and a determination circuit according to aspects of the disclosure.

For example, FIG. 1B is a block diagram of an example control circuit 150 which comprises a programming circuit 151, a counting circuit 152 and a determination circuit 153. The programming circuit may include software, firmware and/or hardware which implements, e.g., steps 1200-1240 of FIGS. 17 and 18A-18C. The counting circuit may include software, firmware and/or hardware which implements, e.g., step 1202 of FIG. 18B. The determination circuit may include software, firmware and/or hardware which implements, e.g., steps 1206, 1218, and 1236 of FIGS. 18A-18C.

The off-chip controller 122 may comprise a processor 122c, storage devices (memory) such as ROM 122a and RAM 122b and an error-correction code (ECC) engine 245.

The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
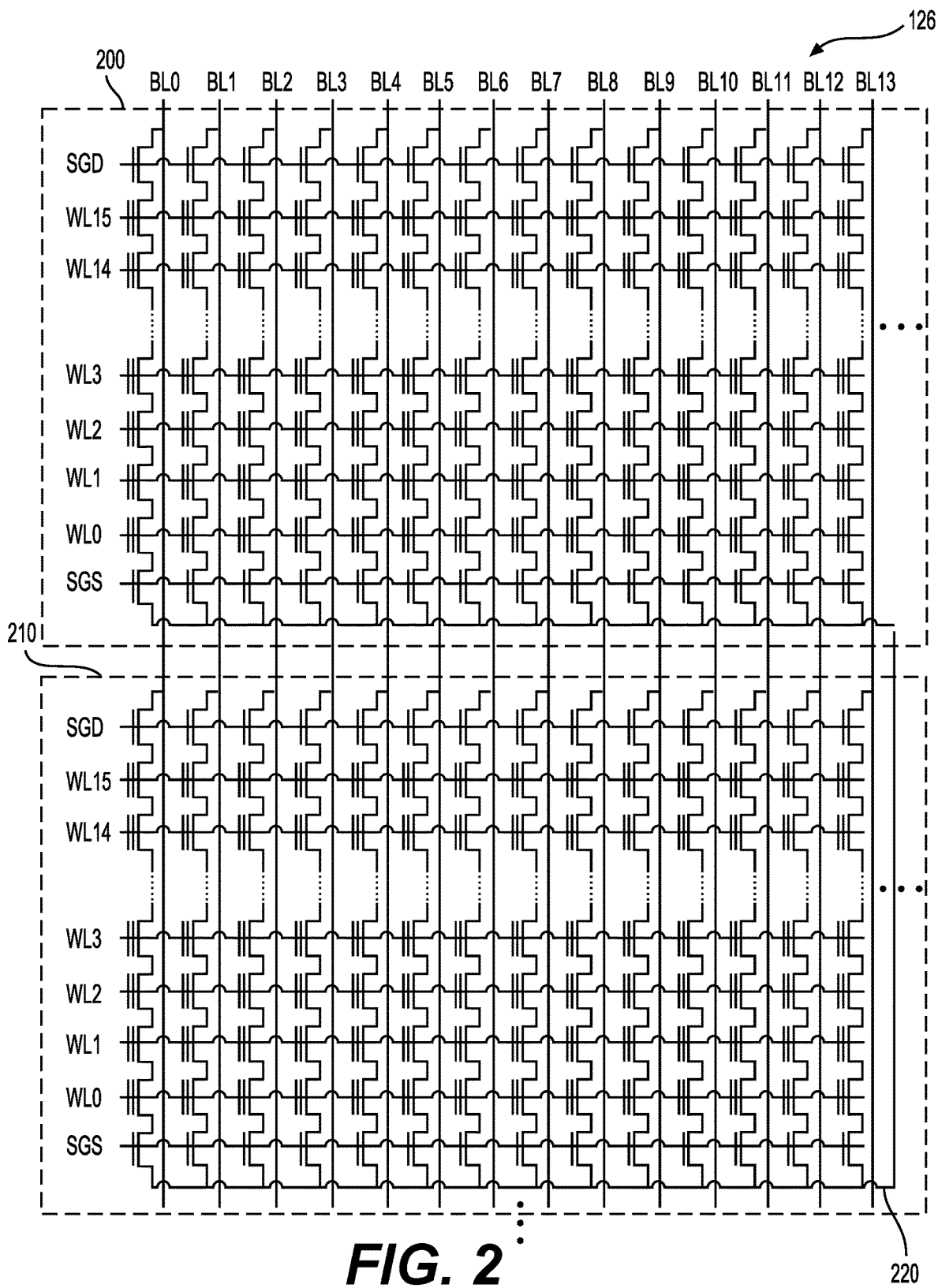
FIG. 2 depicts blocks of memory cells in an example two-dimensional configuration of the memory array of FIG. 1 according to aspects of the disclosure.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
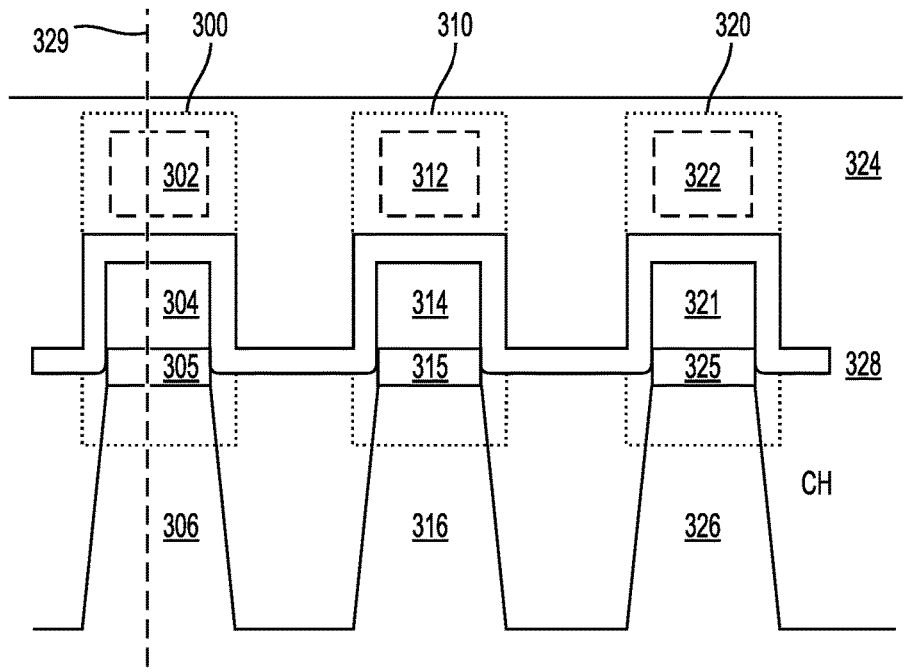
FIG. 3A depicts a cross-sectional view of example floating gate memory cells in NAND strings according to aspects of the disclosure.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
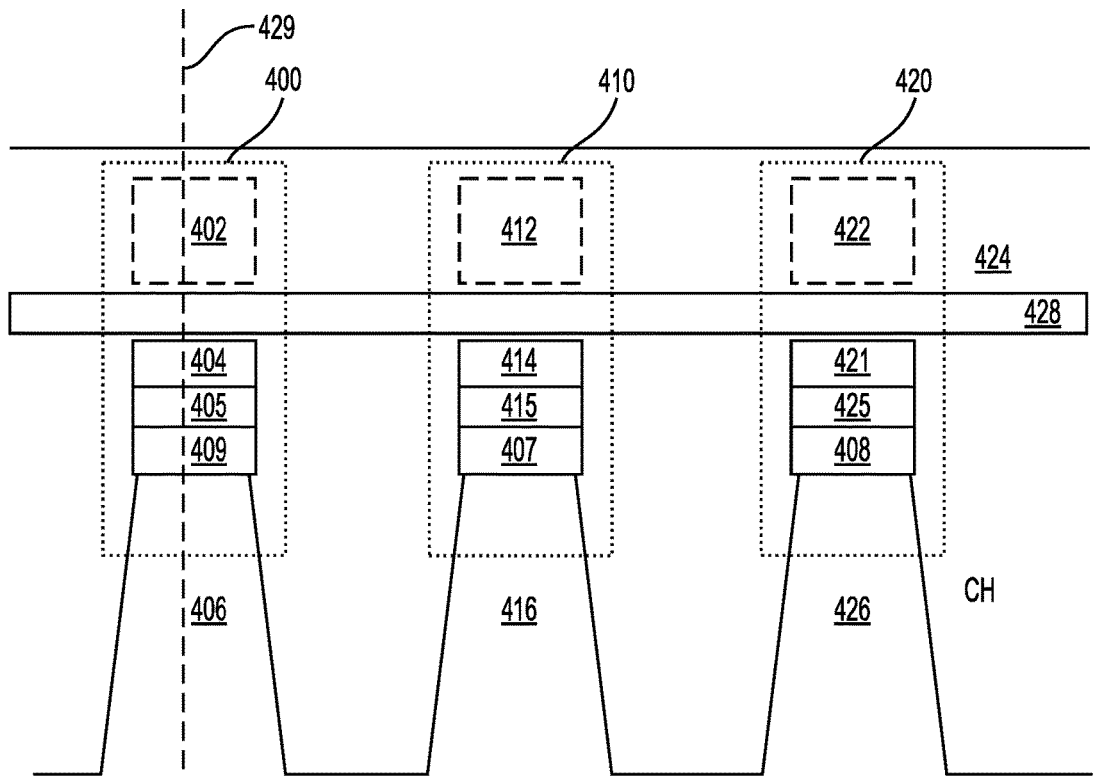
FIG. 4A depicts a cross-sectional view of example charge-trapping memory cells in NAND strings according to aspects of the disclosure.
Figure 4B:
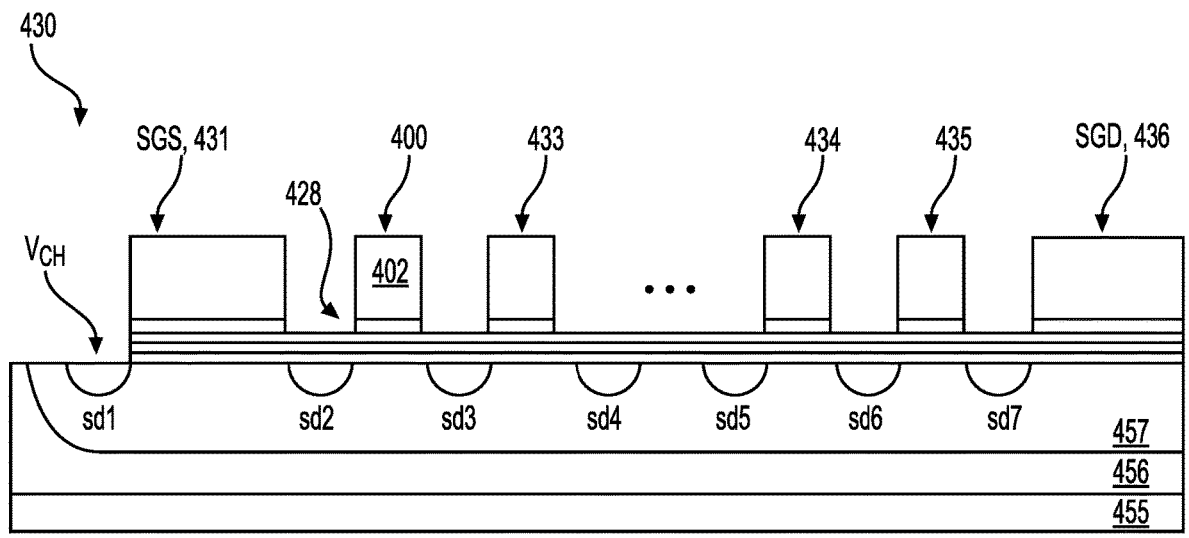
FIG. 4B depicts a cross-sectional view of the structure of FIG. 4A along line 429 according to aspects of the disclosure.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
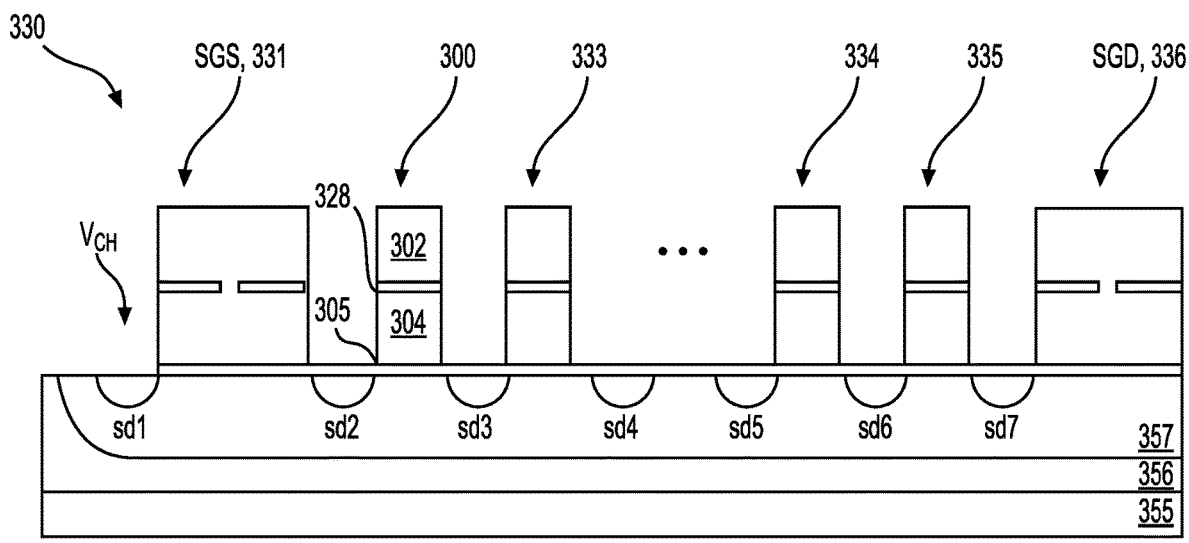
FIG. 3B depicts a cross-sectional view of the structure of FIG. 3A along line 329 according to aspects of the disclosure.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
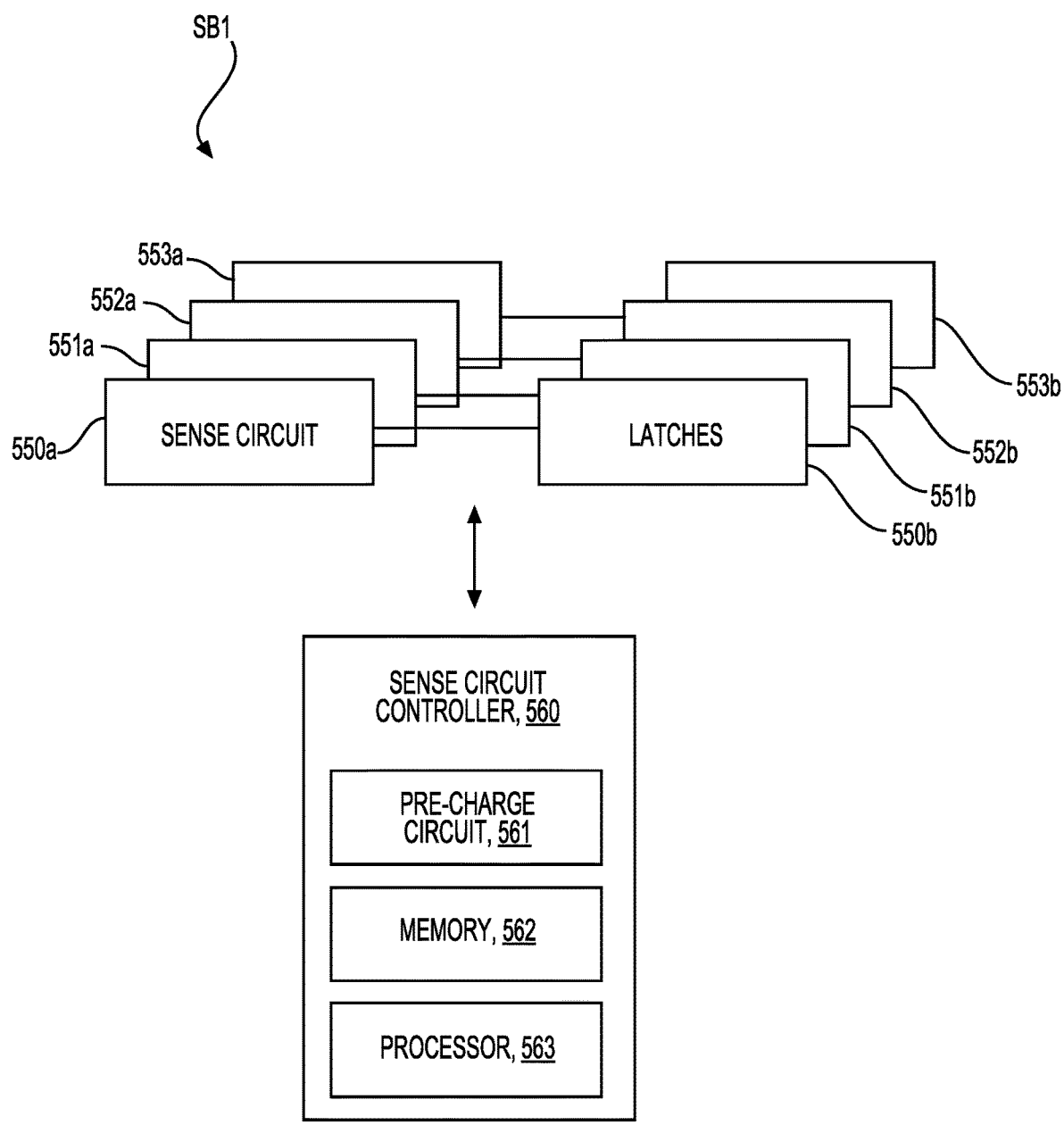
FIG. 5A depicts an example block diagram of a sense block of the memory device of FIG. 1 according to aspects of the disclosure.

FIG. 5A depicts an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
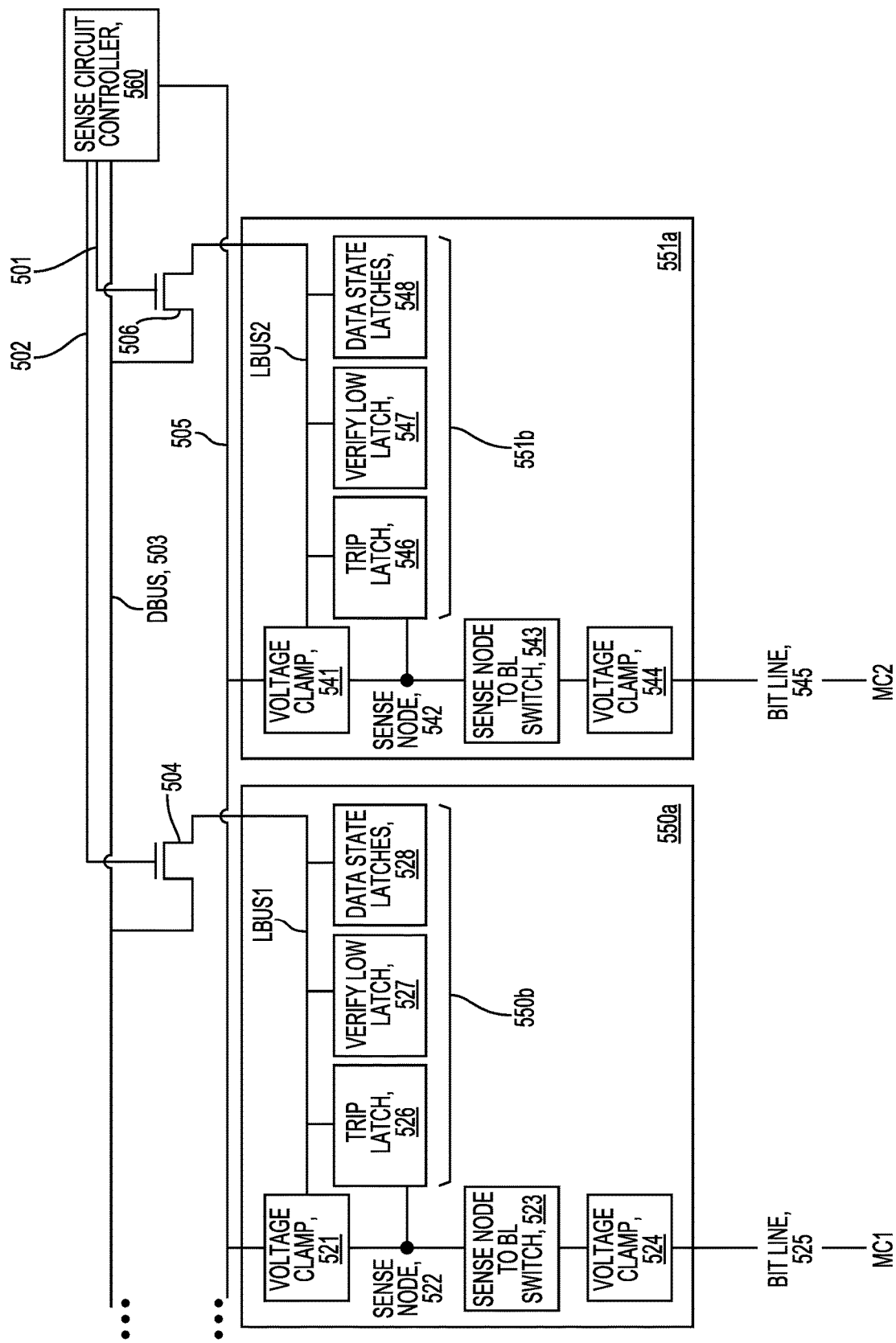
FIG. 5B depicts another example block diagram of the sense block SB1 of FIG. 1 according to aspects of the disclosure.

FIG. 5B depicts another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
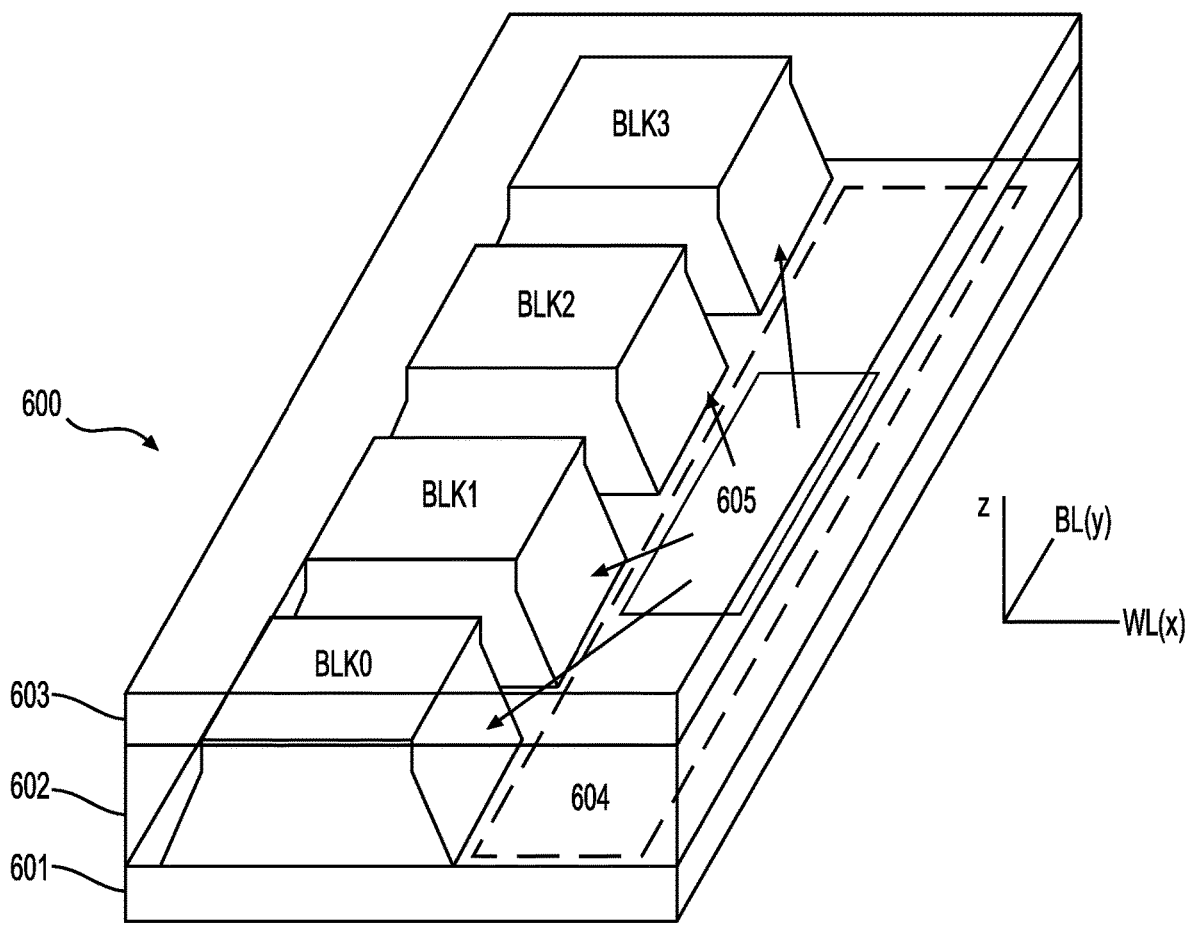
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
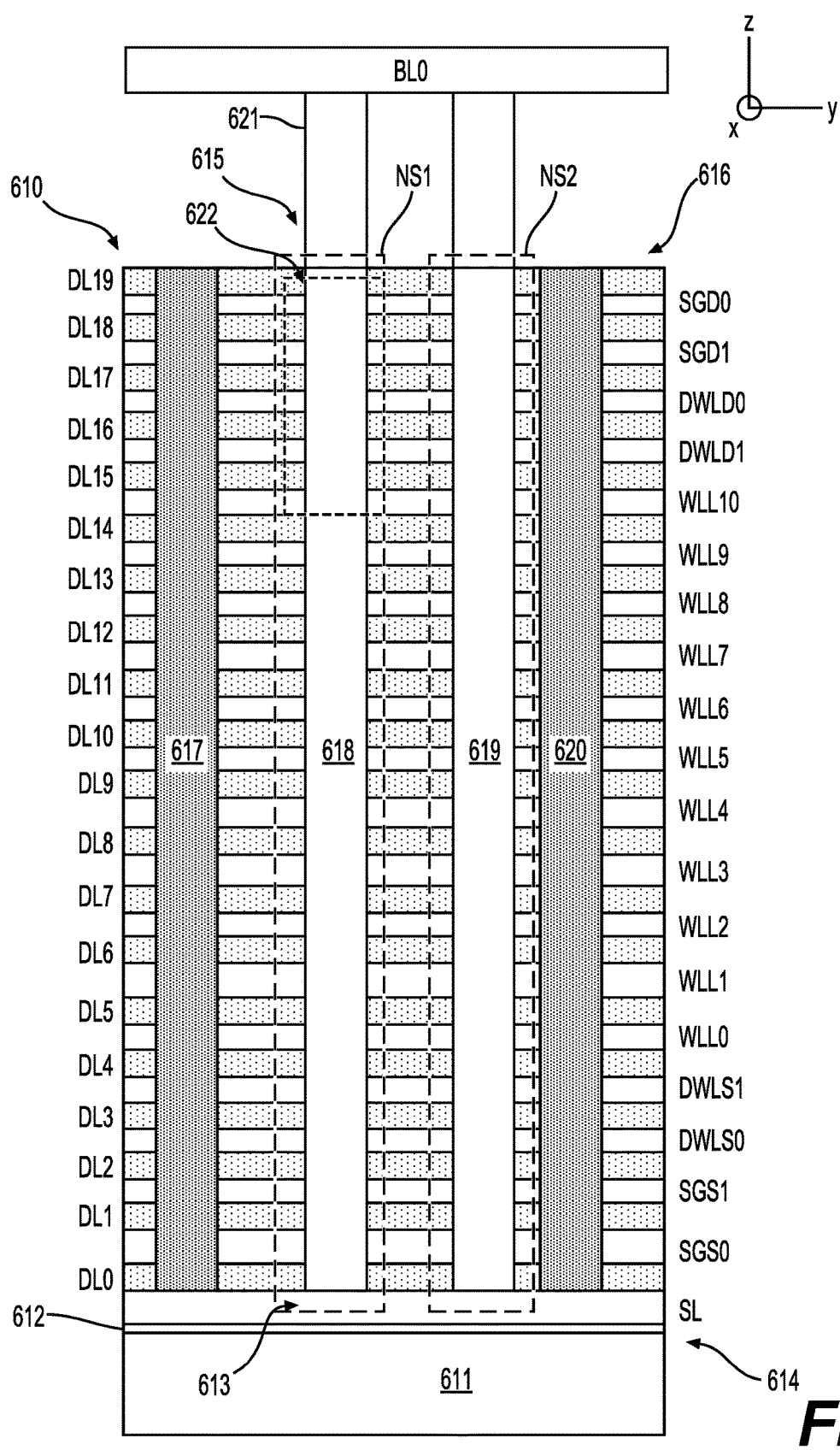
FIG. 6B depicts an example cross-sectional view of a portion of one of the blocks of FIG. 6A according to aspects of the disclosure.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
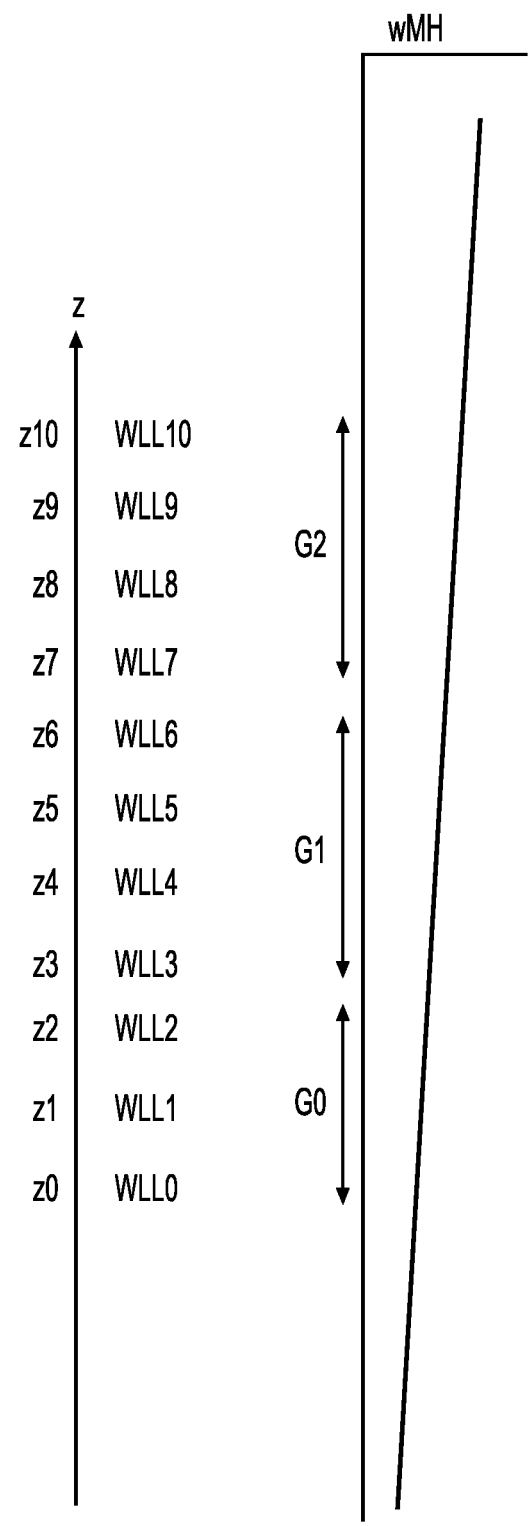
FIG. 6C depicts a plot of memory hole diameter in the stack of FIG. 6B according to aspects of the disclosure.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply a verify scheme for each word line in a group. Different groups can have different verify schemes. For example, groups G0, G1 and G2 include WLL0-WLL2, WLL3-WLL6 and WLL7-WLL10, respectively.

Figure 6D:
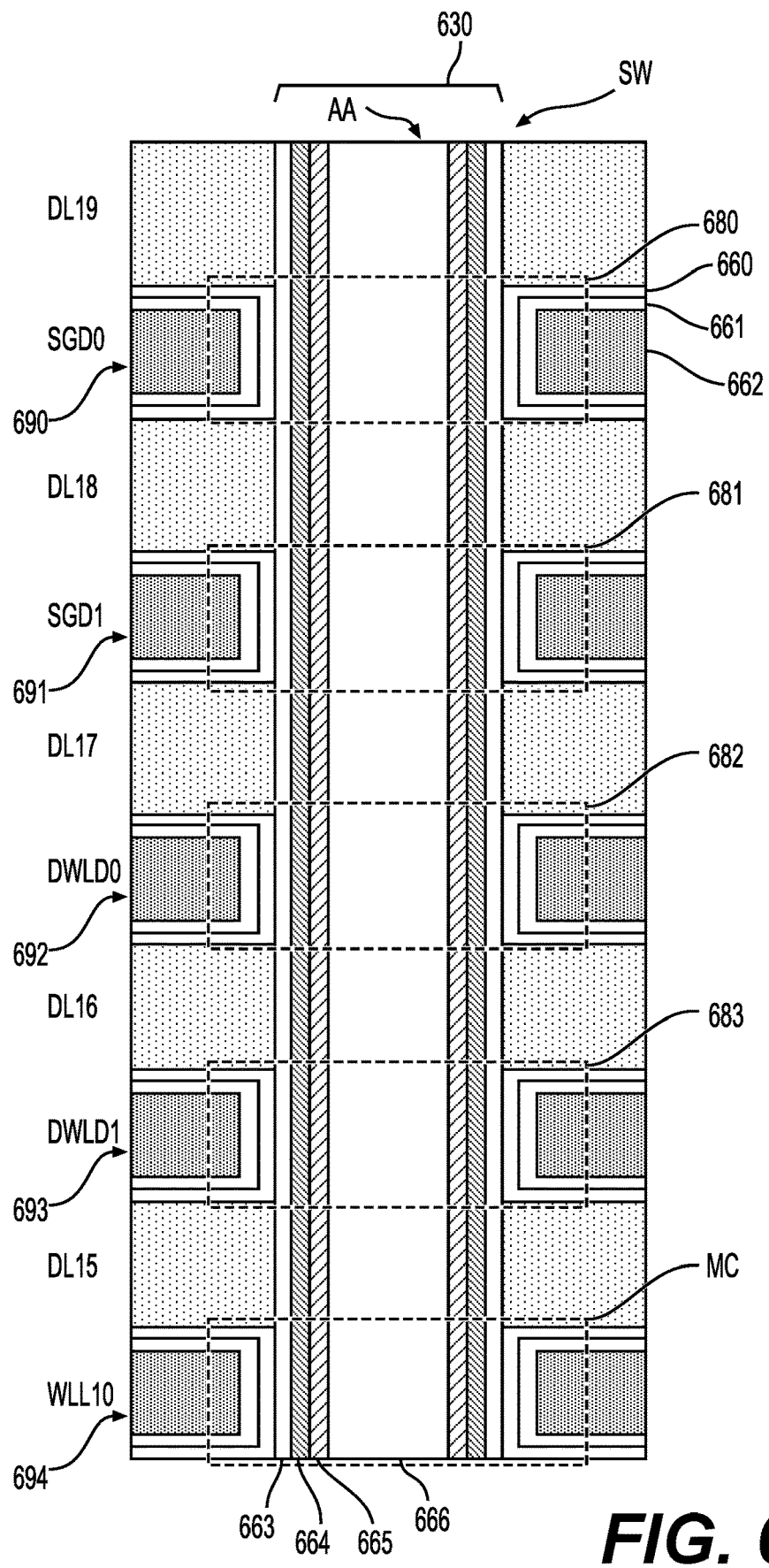
FIG. 6D depicts a close-up view of the region 622 of the stack of FIG. 6B according to aspects of the disclosure.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
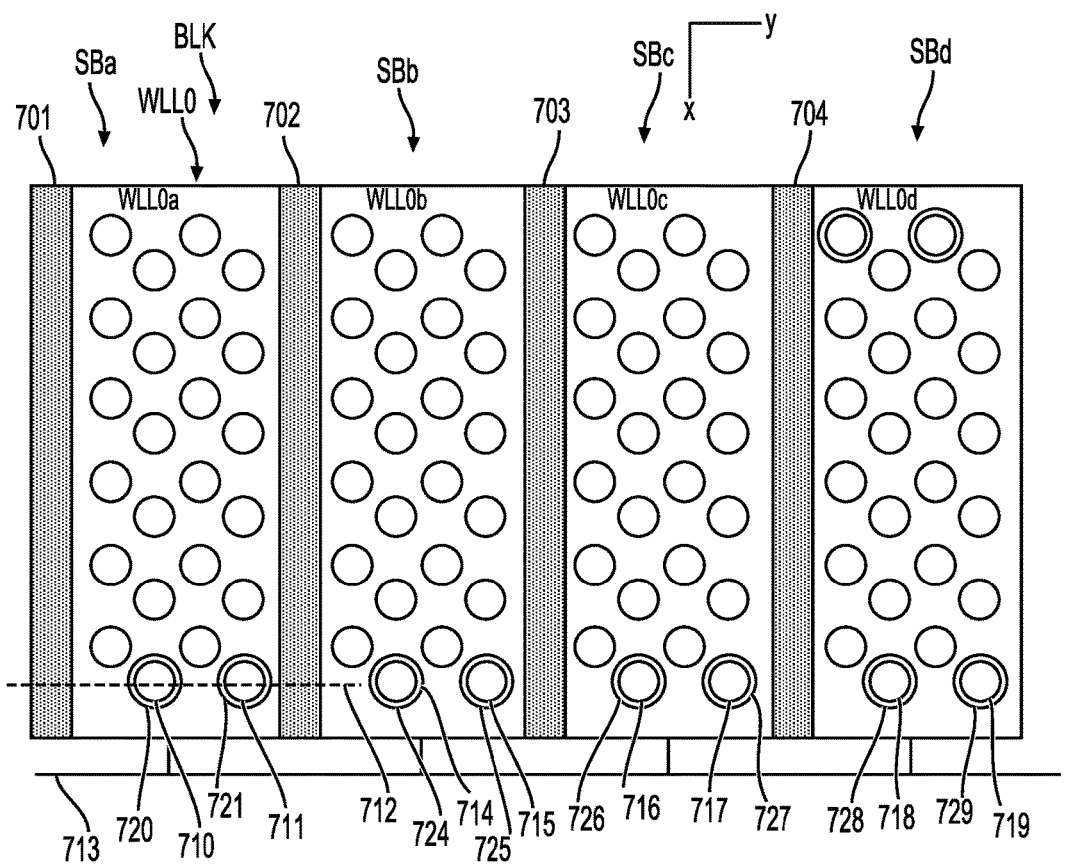
FIG. 7A depicts a top view of an example word line layer WLL0 of the stack of FIG. 6B according to aspects of the disclosure.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

Figure 7B:
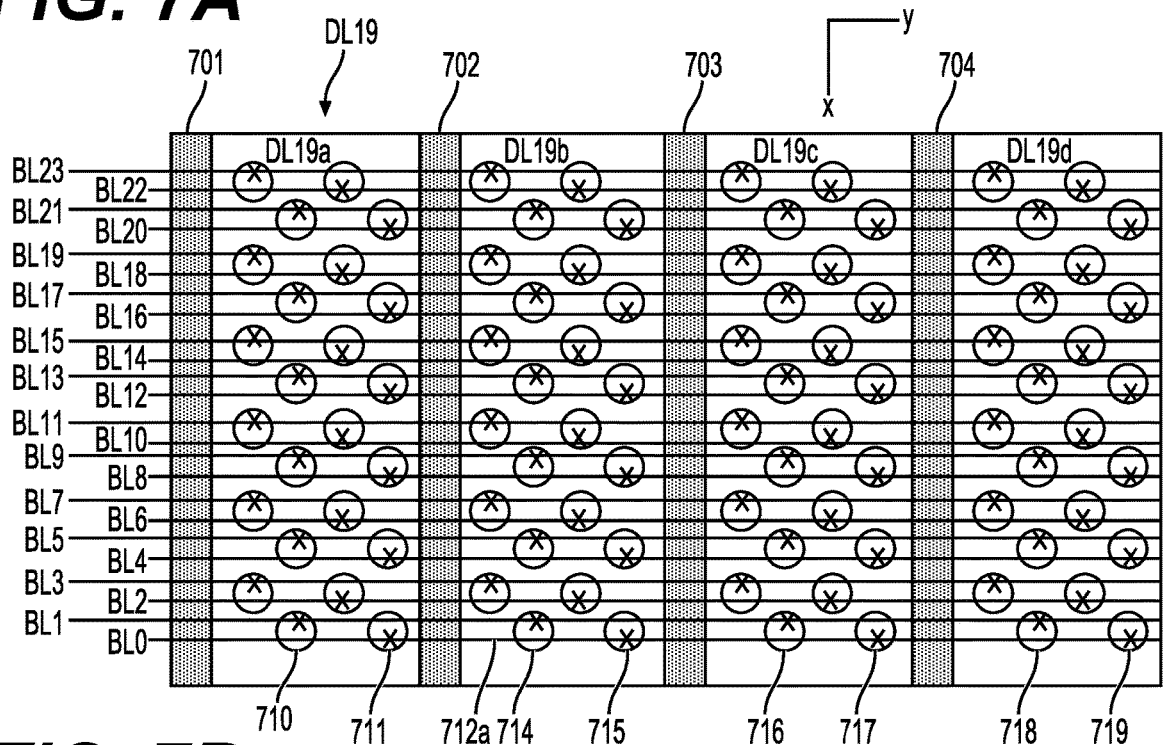
FIG. 7B depicts a top view of an example top dielectric layer DL19 of the stack of FIG. 6B according to aspects of the disclosure.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 713. The last region of a word line layer in a block can be connected to a first region of a word line layer in a next block, in one approach. The connector, in turn, is connected to a voltage driver for the word line layer. The region WLL0a has example memory holes 710 and 711 along a line 712. The region WLL0b has example memory holes 714 and 715. The region WLL0c has example memory holes 716 and 717. The region WLL0d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0a, memory cells 724 and 725 are in WLL0b, memory cells 726 and 727 are in WLL0c, and memory cells 728 and 729 are in WLL0d. These memory cells are at a common height in the stack.

Metal-filled slits 701, 702, 703 and 704 (e.g., metal interconnects) may be located between and adjacent to the edges of the regions WLL0a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 a, DL19 b, DL19 c and DL19 d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
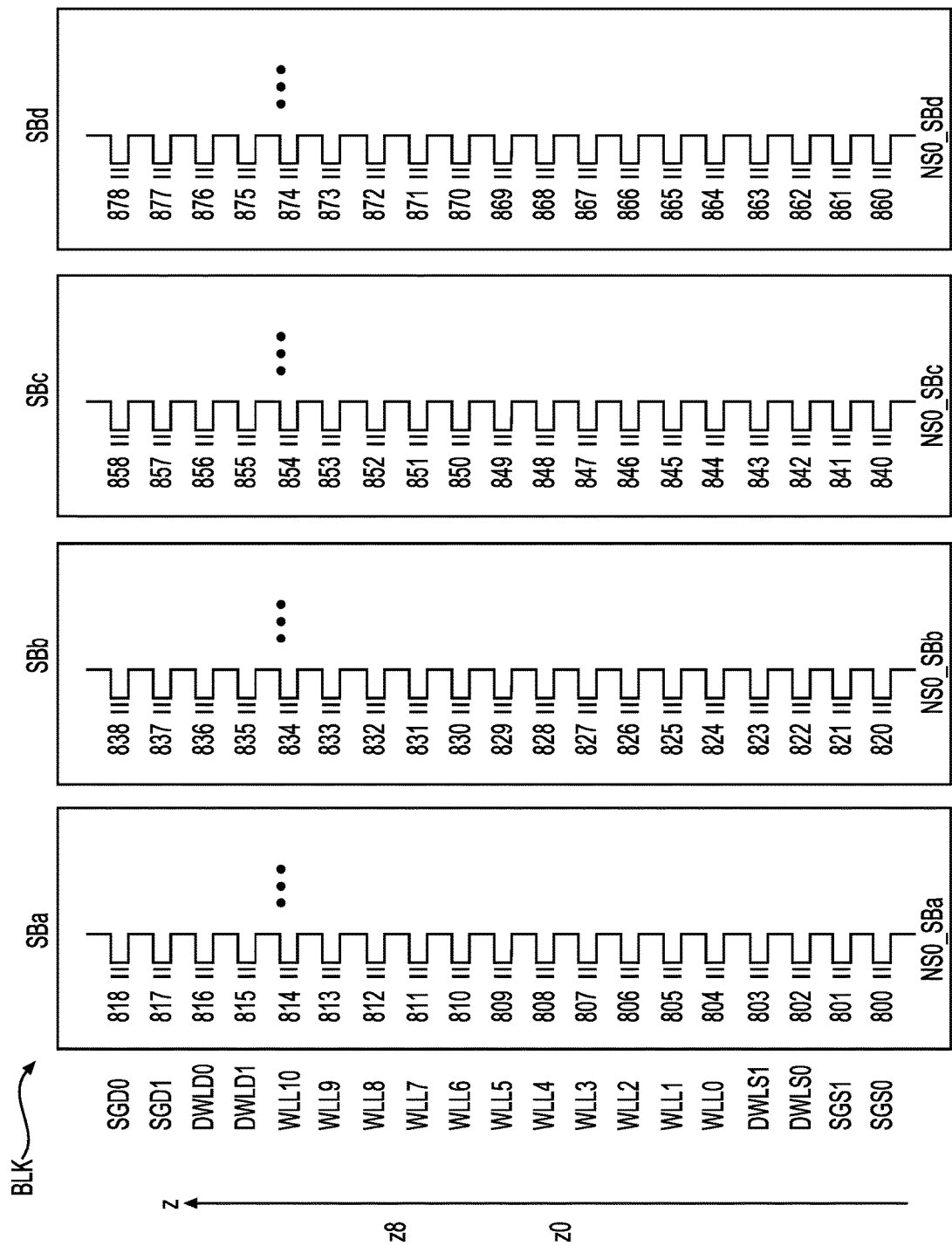
FIG. 8A depicts example NAND strings in the sub-blocks SBa-SBd of FIG. 7A according to aspects of the disclosure.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 9:
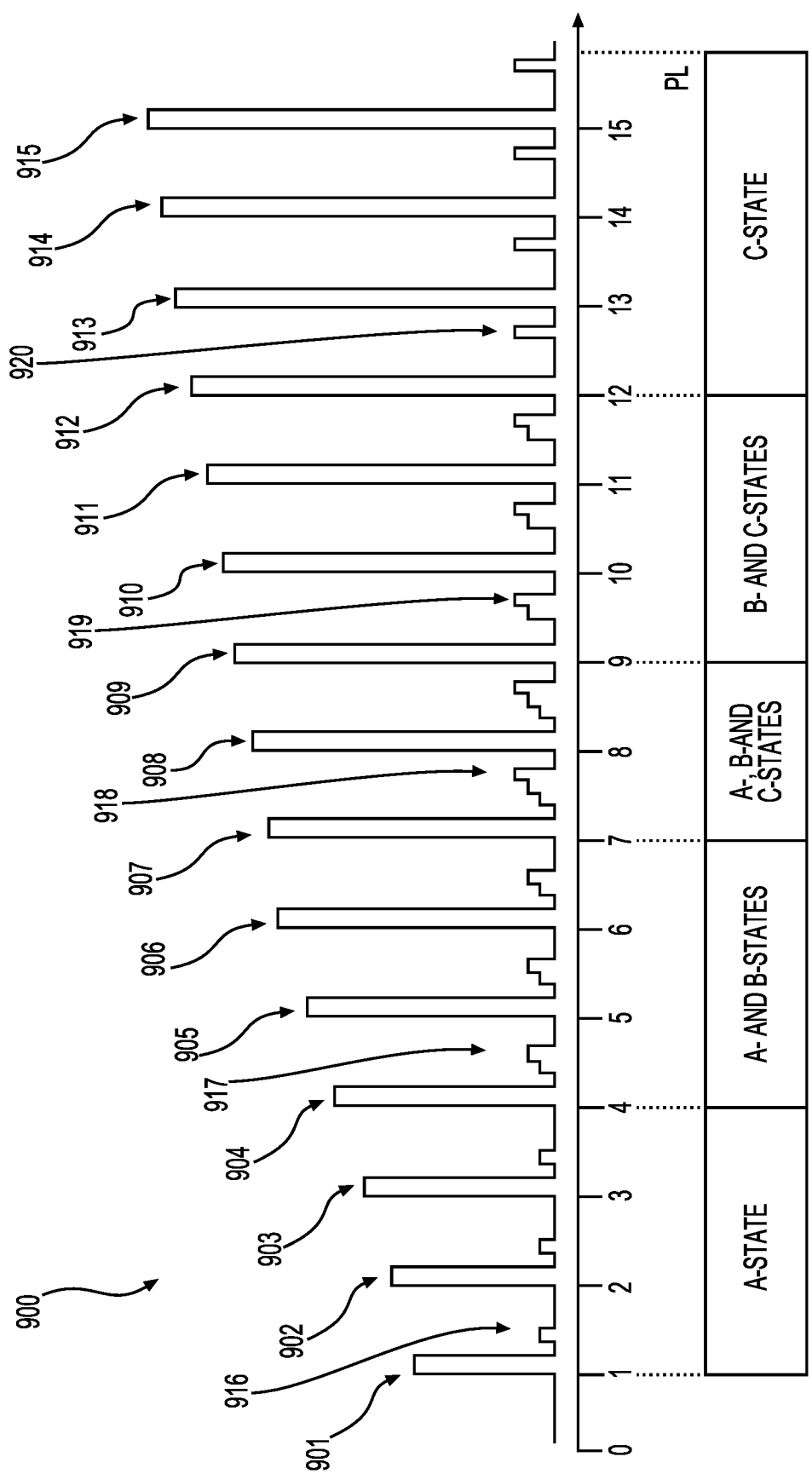
FIG. 9 depicts a waveform of an example programming operation according to aspects of the disclosure n.

FIG. 9 depicts a waveform of an example programming operation. The horizontal axis depicts a program loop number and the vertical axis depicts control gate or word line voltage. Generally, a programming operation can involve applying a pulse train to a selected word line, where the pulse train includes multiple program loops or program-verify (PV) iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming stage in which the programming is completed. ISPP can also be used in each programming stage of a multi-stage operation.

A pulse train typically includes program voltages which increase stepwise in amplitude in each program-verify iteration using a fixed of varying step size. A new pulse train can be applied in each programming stage of a multi-stage programming operation, starting at an initial Vpgm level and ending at a final Vpgm level which does not exceed a maximum allowed level. The initial Vpgm levels can be the same or different in different programming stages. The final Vpgm levels can also be the same or different in different programming stages. The step size can be the same or different in the different programming stages. In some cases, a smaller step size is used in a final programming stage to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 916) may be applied after each of the first, second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

Figure 10:
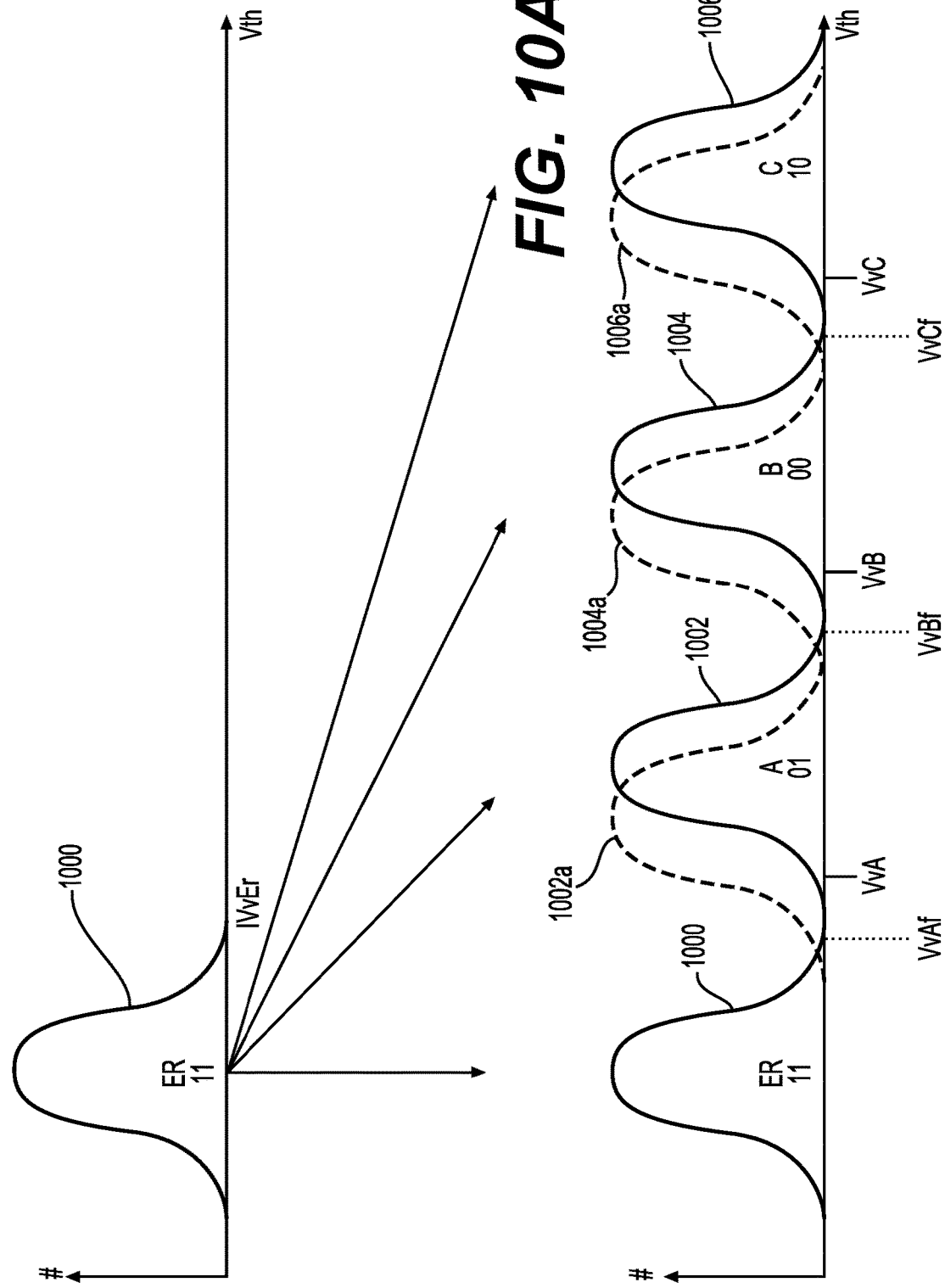
FIGS. 10A and 10B depicts Vth distributions of memory cells after a first programming stage and a second stage of an example two-stage programming operation with four data states according to aspects of the disclosure.

FIGS. 10A and 10B show threshold voltage (Vth) distributions of memory cells in an example two-stage programming operation. Specifically, the memory cells are initially in the erased state (bits 11) as represented by the Vth distribution 1100 shown in FIG. 10A. FIG. 10B depicts Vth distributions of memory cells after a first programming stage and a second programming stage of the example two-stage programming operation with four data states. While two programming stages and four data states are shown, it should be appreciated that any number of programming stages may be utilized (e.g., three or four programming stages) and any number of data states are contemplated.

In the example, the first programming stage causes the Vth of the A, B and C state cells to reach the Vth distributions 1002a, 1004a and 1006a, using first verify voltages of VvAf, VvBf and VvCf, respectively. This first programming stage can be a rough programming which uses a relatively large step size, for instance, so that the Vth distributions 1002a, 1004a and 1006a are relatively wide. The second programming stage may use a smaller step size and causes the Vth distributions 1002a, 1004a and 1006a to transition to the final Vth distributions 1002, 1004 and 1006 (e.g., narrower than Vth distributions 1002a, 1004a and 1006a), using second verify voltages of VvA, VvB, and VvC, respectively. This two-stage programming operation can achieve relatively narrow Vth distributions. A small number of A, B and C state cells (e.g., smaller than a predetermined number of the plurality of memory cells) may have a Vth which is below VvA, VvB or VvC, respectively, due to a bit ignore criteria.

As discussed above, two-stage programming of memory cells can lead to degraded performance compared to one-stage or full sequence programming schemes. Therefore, according to an aspect, the apparatus (e.g., memory device 100) disclosed herein includes the control circuit (e.g., control circuit 150) configured to perform a first programming stage including iteratively programming each of the plurality of memory cells (e.g., data memory cells 804, 805, 806, 807, 808, 809, 810, 811, 812, 813, 814 of FIG. 8A) to one of a plurality of first program states (e.g., Vth distributions 1002a, 10048, and 1006a of FIG. 10B). The first programming stage also includes verifying that one or more of the plurality of memory cells has a threshold voltage above one of a plurality of first verify voltages (e.g., verify voltages VvAf, VvBf, VvCf of FIG. 10B) corresponding to the plurality of first program states. Conventionally, during a first stage program operation, all cells continue to receive program pulses until their threshold voltages are above a desired first stage verify level 1100 (as shown by 1102 on the left in FIG. 11). However, instead of ending the first programming stage after all of the plurality of memory cells are verified to be above the one of a plurality of first verify voltages (e.g., the first stage verify level 1100), the control circuit ends the first programming stage before all of the plurality of memory cells are verified (as shown by 1104 on the right in FIG. 11). Thus, a fraction 1106 of the plurality of memory cells are left below the one of the plurality of first verify voltages during the first programming stage. The fraction 1106 of the plurality of memory cells below the one of the plurality of first verify voltages (e.g., the first stage verify level 1100) can, for example, be greater than one half of a total number of the plurality of memory cells. Nevertheless, it should be appreciated that the fraction 1106 can be any amount.

The control circuit then is configured to perform a second programming stage including iteratively programming each of the plurality of memory cells to one of a plurality of second program states (e.g., Vth distributions 1002, 1004, and 1006 of FIG. 10B) and verifying that at least a predetermined number of the plurality of memory cells each has the threshold voltage above one of a plurality of second verify voltages (e.g., verify voltages VvA, VvB, VvC of FIG. 10B) corresponding to the plurality of second program states. Consequently, the fraction 1106 or leftover cells from the first programming stage are programmed during the second programming stage (i.e., has the threshold voltage above one of the plurality of second verify voltages). While there might be slight penalty in second programming stage timing as the number of verify loops will be higher because of the leftover cells or fraction 1106 that need to be programmed. Accordingly, fewer verify loops are required during the first programming stage and thus, program time is reduced. Even with the slight increase in the second programming stage timing, there is larger reduction in first programming stage timing and net benefit in total program performance. Nevertheless, the threshold voltage width after the second programming stage may degrade somewhat. A default threshold voltage distribution 1108 (i.e., after the first programming stage 1102 and the second programming stage) and a proposed threshold distribution 1110 (i.e., after the first programming stage 1104 and the second programming stage) relative to a first stage verify level 1112 (one of the plurality of second verify voltages) are shown in the second programming stage diagram 1114 shown on the bottom of FIG. 11.

In order to determine when to end the first programming stage before verifying all of the plurality of memory cells, the control circuit is further configured to count a quantity of the one or more of the plurality memory cells having the threshold voltage above the one of the plurality of first verify voltages, such as first stage verify level 1100 (e.g., using the counting circuit 152). The control circuit continues programming and verifying and counting until the quantity is larger than a bit ignore number or threshold quantity $P_s$. Thus, as best shown in FIG. 12, the first programming stage is stopped after the number of cells passing the verify level is higher than the bit ignore number, $P_s$ (region indicated by 1116), leaving a tail or fraction of non-programmed cells (region indicated by 1106).

Another way to leave a tail or fraction 1106 of un-programmed bits would be to count lower-tail bits (i.e., those below the one of the plurality of first verify voltages). Yet, such an approach has some disadvantages. For example, if lower-tail bits (fraction 1106) are counted, the Bit Scan Pass Fail (BSPF) criterion would need to be significantly raised in order to appreciably reduce the number of verify pulses and hence improve performance. Higher BSPF requires larger circuit area (so counter circuits have enough bits) or longer scan timing, which results in increased cost and worse performance. Counting the upper tail or region 1116 more directly indicates when cells are first programmed to the required Vt.

An alternative to higher BSPF is to sample fewer bits. But this reduces the accuracy of the count, especially when cell behavior is not perfectly uniform across an entire page of memory cells. In a random pattern, the total number of cells per state is not always the same. This variation means we cannot set an accurate BSPF when it is a large fraction of the cells. Suppose the number of cells per state could vary between 990 and 1000, and an upper tail BSPF of 1% of the total cells is set. If the upper tail BSPF is set to 10, 1.00%-1.01% of the total cells regardless of whether the total cells is 990 or 1000. In contrast, if the lower tail BSPF is set to 985, then the upper tail fraction varies between 0.5% and 1.5%. So, for the approach described herein, counting the upper tail is more desirable.

As described above, the plurality of memory cells of the apparatus are coupled to a plurality of word lines (e.g., word lines WLL0, Wll1, WLL2, WLL3, WLL4, WLL5, WLL6, WLL7, WLL8, WLL9, WLL10 of FIG. 8A). Thus, in more detail, the control circuit (e.g., control circuit 150) is further configured to iteratively select one of the plurality of word lines and set a first programming voltage (e.g., starting with program voltage 901 of FIG. 9) for the first programming stage. The control circuit then applies the first programming voltage to the one of the plurality of word lines that is selected. The control circuit is configured to select a first verification signal (e.g., starting with verify voltage 916 of FIG. 9) for one of the plurality of first program states and apply the first verification signal to the one of the plurality of word lines that is selected while determining whether the threshold voltage for each of the plurality of memory cells connected to the one of the plurality of word lines is above the one of the plurality of first verify voltages for the one of the plurality of first program states. The control circuit then sets a first lockout status for each of the plurality of memory cells determined to have the threshold voltage above the one of the plurality of first verify voltages for the one of the plurality of first program states. Next, the control circuit is configured to increase the programming voltage (e.g., to another program voltage other than program voltage 901 of FIG. 9) and return to apply the first programming voltage to the one of the plurality of word lines that is selected. The control circuit then determines whether there is another of the plurality of word lines to be programmed. The control circuit is configured to return to select one of the plurality of word lines and set the first programming voltage for the first programming stage in response to determining there is another of the plurality of word lines to be programmed. The control circuit ends the first programming stage before all of the plurality of memory cells are determined to have the threshold voltage above the one of the plurality of first verify voltages corresponding to the one the plurality of first program states for each of the plurality of memory cells.

The control circuit is further configured to iteratively select one of the plurality of word lines and set a second programming voltage for the second programming stage. The control circuit is next configured to apply the second programming voltage to the one of the plurality of word lines that is selected. The control circuit then selects a second verification signal for one of the plurality of second program states and apply the second verification signal to the one of the plurality of word lines that is selected while determining whether the threshold voltage for each of the plurality of memory cells connected to the one of the plurality of word lines is above the one of the plurality of second verify voltages for the one of the plurality of second program states. The control circuit is also configured to set a second lockout status for each of the plurality of memory cells determined to have the threshold voltage above the one of the plurality of second verify voltages for the one of the plurality of second program states. The control circuit increases the second programming voltage and returns to apply the second programming voltage to the one of the plurality of word lines that is selected. Next, the control circuit is configured to determine whether there is another of the plurality of word lines to be programmed. In addition, the control circuit is configured to return to select one of the plurality of word lines and set the second programming voltage for the second programming stage in response to determining there is another of the plurality of word lines to be programmed. The control circuit ends the second programming stage once the predetermined number of the plurality of memory are determined to have the threshold voltage above the one of the plurality of second verify voltages corresponding to the one the plurality of second program states for each of the plurality of memory cells. While the predetermined number can, for example, be all of the plurality of memory cells, it should be understood that the predetermined number may instead be less than the total number of the plurality of memory cells.

As best shown in FIG. 13, two experiments were conducted to determine the impact of reduction of program verify (pvfy) loops by the disclosed apparatus. For the first experiment (Exp 1), the maximum number of programming pulses (NLP) was set to P for state two (S2), state three (S3), and state four (S4) (e.g., for memory cells having sixteen total states and state one being closest to the erased state), which results in reduction in program verify loops of N–P, N+1–P, N+2–P respectively (total 3(N–P+1) pvfy loops saved). For the second experiment (Exp 2), NLP was set to P–2, P, P+2 for S2, S3, S4 respectively, which results in reduction in program verify loops of N–(P–2), N–(P–1), N–P respectively (total 3(N–P+1) pvfy loops saved). Specifically, the measurement procedure includes the following steps: 1) first stage program only S2 with limited NLP and other states at erase, 2) first stage program S3 with limited NLP and other states at erase/inhibited, 3) first stage program S4 with limited NLP and other states at erase/inhibited, 4) first stage program S5-S15 without limited NLP and other states at erase/inhibited, and 5) second stage program 31-S15 with default options. So, in the simulation, the number of verify pulses for states S2, S3 and S4 have been limited. Typically, states S2, S3, S4 need N, N+1, N+2 program loops, respectively to complete programming. The threshold voltage distributions for a default condition (no pvfy reduction) and reduced pvfy condition for both experiments are shown in FIGS. 14A and 14B. For the first programming stage, lower tails for S2-S4 can be seen for reduced pvfy mode.

Experimental data suggests that there is approximately 1.5% improvement in the program performance with proposed scheme with reduced pvfy or program verify (PV) loops and there is ~3.5% degradation in Vt margin (i.e., amount of threshold voltage between states).

Now referring to FIGS. 15A and 15B, it is also observed in the experiments that the final Vt width after the second programming stage is degraded more for S4 (FIG. 15B) compared to S2 (FIG. 15A), when a lower tail is left behind for the two states. This indicates that a larger lower tail (e.g., fraction 1106 of FIG. 11) can be left behind for lower states compared to upper states. Referring back to FIG. 10B, lower states could for example include Vth distribution 1002 and upper states could for example include Vth distributions 1004 and 1006; however, the example shown in FIG. 10B has four states rather than the experiments discussed herein. Thus, the control circuit is further configured to determine the threshold quantity $P_s$ (region indicated as 1116 in FIG. 12) for each of the plurality of memory cells based on which of the plurality of second program states corresponds with each of the plurality of memory cells. In other words, the bit ignore BSPF, $P_s$ can be dependent on the state for any particular memory cell.

As discussed, the threshold voltage of each the plurality of memory cells is within a common range of threshold voltages (see for example FIG. 10B). Therefore, the plurality of second program states includes one or more lower program states (e.g., Vth distribution 1002 of FIG. 10B) having the threshold voltage that is closer to zero volts (i.e., closer to the erase state) and one or more upper program states (e.g., Vth distributions 1004 and 1006 of FIG. 10B) having the threshold voltage that is further from zero volts than the one or more lower program states. Consequently, the threshold quantity or bit ignore BSPF, $P_s$ used for the one or more lower program states can be less than the threshold quantity used for the one or more upper program states (i.e., $P_{S2} < P_{S3} < P_{S4} \ldots$).

According to an additional aspect of the disclosure and shown in FIGS. 16 and 17A-17C, a method of operating the memory apparatus including the plurality of memory cells (e.g., data memory cells 804, 805, 806, 807, 808, 809, 810, 811, 812, 813, 814 of FIG. 8A), is also provided. The method includes the step of 1200 performing a first programming stage including iteratively programming each of the plurality of memory cells to one of a plurality of first program states (e.g., Vth distributions 1002a, 1004a, and 1006a of FIG. 10B) and verifying that one or more of the plurality of memory cells has a threshold voltage above one of a plurality of first verify voltages (e.g., verify voltages VvAf, VvBf, VvCf of FIG. 10B) corresponding to the plurality of first program states and ending the first programming stage before all of the plurality of memory cells are verified thereby leaving a fraction 1106 of the plurality of memory cells below the one of a plurality of first verify voltages. Again, the fraction 1106 of the plurality of memory cells below the one of a plurality of first verify voltages can be greater than one half of a total number of the plurality of memory cells.

Also, in more detail, the method can include the step of 1202 counting a quantity of the one or more of the plurality memory cells having the threshold voltage above the one of the plurality of first verify voltages such as first stage verify level 1100 of FIG. 11 (e.g., using the counting circuit 152). The method can also include the step of 1204 continuing programming and verifying and counting until the quantity is larger than a threshold quantity. The method can further include the step of 1206 determining the threshold quantity for each of the plurality of memory cells based on which of the plurality of second program states corresponds with each of the plurality of memory cells. Again, the threshold voltage of each the plurality of memory cells can be within a common range of threshold voltages and the plurality of second program states includes one or more lower program states (e.g., Vth distribution 1002 of FIG. 10B) having the threshold voltage being closer to zero volts and one or more upper program states (e.g., Vth distributions 1004 and 1006 of FIG. 10B) having the threshold voltage being further from zero volts than the one or more lower program states. Therefore, the threshold quantity $P_s$ used for the one or more lower program states is less than the threshold quantity used for the one or more upper program states.

In addition, the step of 1200 performing the first programming stage including iteratively programming each of the plurality of memory cells to one of the plurality of first program states and verifying that one or more of the plurality of memory cells has the threshold voltage, above one of the plurality of first verify voltages corresponding to the plurality of first program states and ending the first programming stage before all of the plurality of memory cells are verified thereby leaving the fraction of the plurality of memory cells below the one of the plurality of first verify voltages can include the steps of iteratively 1208 selecting one of the plurality of word lines and setting a first programming voltage for the first programming stage and 1210 applying the first programming voltage to the one of the plurality of word lines that is selected. The method can continue by 1212 selecting a first verification signal for one of the plurality of first program states and applying the first verification signal to the one of the plurality of word lines that is selected while determining whether the threshold voltage for each of the plurality of memory cells connected to the one of the plurality of word lines is above the one of the plurality of first verify voltages for the one of the plurality of first program states. The next step of the method is 1214 setting a first lockout status for each of the plurality of memory cells determined to have the threshold voltage above the one of the plurality of first verify voltages for the one of the plurality of first program states. The method can then include the step of 1216 increasing the programming voltage and returning to applying the first programming voltage to the one of the plurality of word lines that is selected. Next, 1218 determining whether there is another of the plurality of word lines to be programmed. The method proceeds with the step of 1220 returning to 1208 selecting one of the plurality of word lines and setting the first programming voltage for the first programming stage in response to determining there is another of the plurality of word lines to be programmed. The method then includes the step of 1222 ending the first programming stage before all of the plurality of memory cells are determined to have the threshold voltage above the one of the plurality of first verify voltages corresponding to the one the plurality of first program states for each of the plurality of memory cells.

The method continues with the step of 1224 performing a second programming stage including iteratively programming each of the plurality of memory cells to one of a plurality of second program states (e.g., Vth distributions 1002, 1004, and 1006 of FIG. 10B) and verifying that at least a predetermined number of the plurality of memory cells each has the threshold voltage above one of a plurality of second verify voltages (e.g., verify voltages VvA, VvB, VvC of FIG. 10B) corresponding to the plurality of second program states. More specifically, the step of 1224 performing the second programming stage including iteratively programming each of the plurality of memory cells to one of the plurality of second program states and verifying that the at least a predetermined number of the plurality of memory cells each has the threshold voltage above one of the plurality of second verify voltages corresponding to the plurality of second program states can further include the step of 1226 selecting one of the plurality of word lines and set a second programming voltage for the second programming stage. The method can then include the step of 1228 applying the second programming voltage to the one of the plurality of word lines that is selected. Next, 1230 selecting a second verification signal for one of the plurality of second program states and applying the second verification signal to the one of the plurality of word lines that is selected while determining whether the threshold voltage for each of the plurality of memory cells connected to the one of the plurality of word lines is above the one of the plurality of second verify voltages for the one of the plurality of second program states. The method can then proceed with the step of 1232 setting a second lockout status for each of the plurality of memory cells determined to have the threshold voltage above the one of the plurality of second verify voltages for the one of the plurality of second program states. The method then includes the step of 1234 increasing the second programming voltage and returning to applying the second programming voltage to the one of the plurality of word lines that is selected. The next step of the method is 1236 determining whether there is another of the plurality of word lines to be programmed. The method continues with the step of 1238 returning to 1226 selecting one of the plurality of word lines and setting the second programming voltage for the second programming stage in response to determining there is another of the plurality of word lines to be programmed. Then, the method can include the step of 1240 ending the second programming stage once the predetermined number of the plurality of memory are determined to have the threshold voltage above the one of the plurality of second verify voltages corresponding to the one the plurality of second program states for each of the plurality of memory cells.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
a plurality of memory cells;
a control circuit coupled to the plurality of memory cells and configured to:
perform a first programming stage including iteratively programming each of the plurality of memory cells to one of a plurality of first program states and verifying that one or more of the plurality of memory cells has a threshold voltage above one of a plurality of first verify voltages corresponding to the plurality of first program states and ending the first programming stage before all of the plurality of memory cells are verified thereby leaving a fraction of the plurality of memory cells below the one of a plurality of first verify voltages, and
perform a second programming stage including iteratively programming each of the plurality of memory cells to one of a plurality of second program states and verifying that at least a predetermined number of the plurality of memory cells each has the threshold voltage above one of a plurality of second verify voltages corresponding to the plurality of second program states.

2. The apparatus as set forth in claim 1, wherein the control circuit is further configured to count a quantity of the one or more of the plurality memory cells having the threshold voltage above the one of the plurality of first verify voltages and continue programming and verifying and counting until the quantity is larger than a threshold quantity.

3. The apparatus as set forth in claim 2, wherein the control circuit is further configured to determine the threshold quantity for each of the plurality of memory cells based on which of the plurality of second program states corresponds with each of the plurality of memory cells.

4. The apparatus as set forth in claim 3, wherein the threshold voltage of each the plurality of memory cells is within a common range of threshold voltages and the plurality of second program states includes one or more lower program states having the threshold voltage being closer to zero volts and one or more upper program states having the threshold voltage being further from zero volts than the one or more lower program states and the threshold quantity used for the one or more lower program states is less than the threshold quantity used for the one or more upper program states.

5. The apparatus as set forth in claim 1, wherein the fraction of the plurality of memory cells below the one of a plurality of first verify voltages is greater than one half of a total number of the plurality of memory cells.

6. The apparatus as set forth in claim 1, wherein the plurality of memory cells are coupled to a plurality of word lines and the control circuit is further configured to iteratively:
select one of the plurality of word lines and set a first programming voltage for the first programming stage,
apply the first programming voltage to the one of the plurality of word lines that is selected,
select a first verification signal for one of the plurality of first program states and apply the first verification signal to the one of the plurality of word lines that is selected while determining whether the threshold voltage for each of the plurality of memory cells connected to the one of the plurality of word lines is above the one of the plurality of first verify voltages for the one of the plurality of first program states,
set a first lockout status for each of the plurality of memory cells determined to have the threshold voltage above the one of the plurality of first verify voltages for the one of the plurality of first program states, increase the programming voltage and return to apply the first programming voltage to the one of the plurality of word lines that is selected, determine whether there is another of the plurality of word lines to be programmed, return to select one of the plurality of word lines and set the first programming voltage for the first programming stage in response to determining there is another of the plurality of word lines to be programmed, and end the first programming stage before all of the plurality of memory cells are determined to have the threshold voltage above the one of the plurality of first verify voltages corresponding to the one the plurality of first program states for each of the plurality of memory cells.

7. The apparatus as set forth in claim 6, wherein the control circuit is further configured to iteratively:

select one of the plurality of word lines and set a second programming voltage for the second programming stage, apply the second programming voltage to the one of the plurality of word lines that is selected, select a second verification signal for one of the plurality of second program states and apply the second verification signal to the one of the plurality of word lines that is selected while determining whether the threshold voltage for each of the plurality of memory cells connected to the one of the plurality of word lines is above the one of the plurality of second verify voltages for the one of the plurality of second program states, set a second lockout status for each of the plurality of memory cells determined to have the threshold voltage above the one of the plurality of second verify voltages for the one of the plurality of second program states, increase the second programming voltage and return to apply the second programming voltage to the one of the plurality of word lines that is selected, determine whether there is another of the plurality of word lines to be programmed, return to select one of the plurality of word lines and set the second programming voltage for the second programming stage in response to determining there is another of the plurality of word lines to be programmed, and end the second programming stage once the predetermined number of the plurality of memory cells are determined to have the threshold voltage above the one of the plurality of second verify voltages corresponding to the one the plurality of second program states for each of the plurality of memory cells.

8. A controller in communication with a plurality of memory cells of a memory apparatus, the controller configured to:

instruct the memory apparatus to perform a first programming stage including iteratively programming each of the plurality of memory cells to one of a plurality of first program states and verifying that one or more of the plurality of memory cells has a threshold voltage above one of a plurality of first verify voltages corresponding to the plurality of first program states and ending the first programming stage before all of the plurality of memory cells are verified thereby leaving a fraction of the plurality of memory cells below the one of a plurality of first verify voltages; and instruct the memory apparatus perform a second programming stage including iteratively programming each of the plurality of memory cells to one of a plurality of second program states and verifying that at least a predetermined number of the plurality of memory cells each has the threshold voltage above one of a plurality of second verify voltages corresponding to the plurality of second program states.

9. The controller as set forth in claim 8, wherein the controller is further configured to instruct the memory apparatus to count a quantity of the one or more of the plurality memory cells having the threshold voltage above the one of the plurality of first verify voltages and instruct the memory apparatus to continue programming and verifying and counting until the quantity is larger than a threshold quantity.

10. The controller as set forth in claim 9, wherein the controller is further configured to determine the threshold quantity for each of the plurality of memory cells based on which of the plurality of second program states corresponds with each of the plurality of memory cells.

11. The controller as set forth in claim 10, wherein the threshold voltage of each the plurality of memory cells is within a common range of threshold voltages and the plurality of second program states includes one or more lower program states having the threshold voltage being closer to zero volts and one or more upper program states having the threshold voltage being further from zero volts than the one or more lower program states and the threshold quantity used for the one or more lower program states is less than the threshold quantity used for the one or more upper program states.

12. The controller as set forth in claim 8, wherein the plurality of memory cells are coupled to a plurality of word lines and the controller is further configured to iteratively:

instruct the memory apparatus to select one of the plurality of word lines and set a first programming voltage for the first programming stage, instruct the memory apparatus to apply the first programming voltage to the one of the plurality of word lines that is selected, select a first verification signal for one of the plurality of first program states and instruct the memory apparatus to apply the first verification signal to the one of the plurality of word lines that is selected while determining whether the threshold voltage for each of the plurality of memory cells connected to the one of the plurality of word lines is above the one of the plurality of first verify voltages for the one of the plurality of first program states, set a first lockout status for each of the plurality of memory cells determined to have the threshold voltage above the one of the plurality of first verify voltages for the one of the plurality of first program states, instruct the memory apparatus to increase the programming voltage and return to instruct the memory apparatus to apply the first programming voltage to the one of the plurality of word lines that is selected, determine whether there is another of the plurality of word lines to be programmed, return to instruct the memory apparatus to select one of the plurality of word lines and set the first programming voltage for the first programming stage in response to determining there is another of the plurality of word lines to be programmed, and instruct the memory apparatus to end the first programming stage before all of the plurality of memory cells are determined to have the threshold voltage above the one of the plurality of first verify voltages corresponding to the one the plurality of first program states for each of the plurality of memory cells.

13. The controller as set forth in claim 12, wherein the controller is further configured to iteratively:
instruct the memory apparatus to select one of the plurality of word lines and set a second programming voltage for the second programming stage,
instruct the memory apparatus to apply the second programming voltage to the one of the plurality of word lines that is selected,
select a second verification signal for one of the plurality of second program states and instruct the memory apparatus to apply the second verification signal to the one of the plurality of word lines that is selected while determining whether the threshold voltage for each of the plurality of memory cells connected to the one of the plurality of word lines is above the one of the plurality of second verify voltages for the one of the plurality of second program states,
set a second lockout status for each of the plurality of memory cells determined to have the threshold voltage above the one of the plurality of second verify voltages for the one of the plurality of second program states,
instruct the memory apparatus to increase the second programming voltage and return to instruct the memory apparatus to apply the second programming voltage to the one of the plurality of word lines that is selected,
determine whether there is another of the plurality of word lines to be programmed,
return to instruct the memory apparatus to select one of the plurality of word lines and set the second programming voltage for the second programming stage in response to determining there is another of the plurality of word lines to be programmed, and
instruct the memory apparatus to end the second programming stage once the predetermined number of the plurality of memory cells are determined to have the threshold voltage above the one of the plurality of second verify voltages corresponding to the one the plurality of second program states for each of the plurality of memory cells.

14. A method of operating a memory apparatus including a plurality of memory cells, the method comprising the steps of:
performing a first programming stage including iteratively programming each of the plurality of memory cells to one of a plurality of first program states and verifying that one or more of the plurality of memory cells has a threshold voltage above one of a plurality of first verify voltages corresponding to the plurality of first program states and ending the first programming stage before all of the plurality of memory cells are verified thereby leaving a fraction of the plurality of memory cells below the one of a plurality of first verify voltages; and
performing a second programming stage including iteratively programming each of the plurality of memory cells to one of a plurality of second program states and verifying that at least a predetermined number of the plurality of memory cells each has the threshold voltage above one of a plurality of second verify voltages corresponding to the plurality of second program states.

15. The method as set forth in claim 14, further including the steps of:
counting a quantity of the one or more of the plurality of memory cells having the threshold voltage above the one of the plurality of first verify voltages; and
continuing programming and verifying and counting until the quantity is larger than a threshold quantity.

16. The method as set forth in claim 15, further including the step of determining the threshold quantity for each of the plurality of memory cells based on which of the plurality of second program states corresponds with each of the plurality of memory cells.

17. The method as set forth in claim 16, wherein the threshold voltage of each the plurality of memory cells is within a common range of threshold voltages and the plurality of second program states includes one or more lower program states having the threshold voltage being closer to zero volts and one or more upper program states having the threshold voltage being further from zero volts than the one or more lower program states and the threshold quantity used for the one or more lower program states is less than the threshold quantity used for the one or more upper program states.

18. The method as set forth in claim 14, wherein the fraction of the plurality of memory cells below the one of a plurality of first verify voltages is greater than one half of a total number of the plurality of memory cells.

19. The method as set forth in claim 14, wherein the plurality of memory cells are coupled to a plurality of word lines and the step of performing the first programming stage including iteratively programming each of the plurality of memory cells to one of the plurality of first program states and verifying that one or more of the plurality of memory cells has the threshold voltage above one of the plurality of first verify voltages corresponding to the plurality of first program states and ending the first programming stage before all of the plurality of memory cells are verified thereby leaving the fraction of the plurality of memory cells below the one of the plurality of first verify voltages includes the steps of iteratively:
selecting one of the plurality of word lines and set a first programming voltage for the first programming stage;
applying the first programming voltage to the one of the plurality of word lines that is selected;
selecting a first verification signal for one of the plurality of first program states and applying the first verification signal to the one of the plurality of word lines that is selected while determining whether the threshold voltage for each of the plurality of memory cells connected to the one of the plurality of word lines is above the one of the plurality of first verify voltages for the one of the plurality of first program states;
setting a first lockout status for each of the plurality of memory cells determined to have the threshold voltage above the one of the plurality of first verify voltages for the one of the plurality of first program states;
increasing the programming voltage and returning to applying the first programming voltage to the one of the plurality of word lines that is selected;
determining whether there is another of the plurality of word lines to be programmed;
returning to selecting one of the plurality of word lines and setting the first programming voltage for the first programming stage in response to determining there is another of the plurality of word lines to be programmed; and
ending the first programming stage before all of the plurality of memory cells are determined to have the threshold voltage above the one of the plurality of first verify voltages corresponding to the one the plurality of first program states for each of the plurality of memory cells.

20. The method as set forth in claim 19, wherein the step of performing the second programming stage including iteratively programming each of the plurality of memory cells to one of the plurality of second program states and verifying that the at least a predetermined number of the plurality of memory cells each has the threshold voltage above one of the plurality of second verify voltages corresponding to the plurality of second program states further includes the steps of:
- selecting one of the plurality of word lines and set a second programming voltage for the second programming stage;
- applying the second programming voltage to the one of the plurality of word lines that is selected;
- selecting a second verification signal for one of the plurality of second program states and applying the second verification signal to the one of the plurality of word lines that is selected while determining whether the threshold voltage for each of the plurality of memory cells connected to the one of the plurality of word lines is above the one of the plurality of second verify voltages for the one of the plurality of second program states;
- setting a second lockout status for each of the plurality of memory cells determined to have the threshold voltage above the one of the plurality of second verify voltages for the one of the plurality of second program states;
- increasing the second programming voltage and returning to applying the second programming voltage to the one of the plurality of word lines that is selected;
- determining whether there is another of the plurality of word lines to be programmed;
- returning to selecting one of the plurality of word lines and setting the second programming voltage for the second programming stage in response to determining there is another of the plurality of word lines to be programmed; and
- ending the second programming stage once the predetermined number of the plurality of memory cells are determined to have the threshold voltage above the one of the plurality of second verify voltages corresponding to the one the plurality of second program states for each of the plurality of memory cells.

* * * * *